(12) United States Patent
Peng et al.

(10) Patent No.: US 12,376,401 B2
(45) Date of Patent: Jul. 29, 2025

(54) METHODS OF FORMING OPTICAL MODULES

(71) Applicant: Taiwan Semiconductor Manufacturing Company, Ltd., Hsin-Chu (TW)

(72) Inventors: Jung-Huei Peng, Hsinchu (TW); Chun-Wen Cheng, Hsinchu County (TW); Yi-Chien Wu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 495 days.

(21) Appl. No.: 17/899,863

(22) Filed: Aug. 31, 2022

(65) Prior Publication Data

US 2023/0317753 A1    Oct. 5, 2023

Related U.S. Application Data

(60) Provisional application No. 63/324,734, filed on Mar. 29, 2022.

(51) Int. Cl.
*H01L 27/146* (2006.01)
*B32B 7/12* (2006.01)
(Continued)

(52) U.S. Cl.
CPC ............ *H10F 39/806* (2025.01); *B32B 7/12* (2013.01); *B32B 37/1207* (2013.01); *B32B 38/0004* (2013.01); *H01S 5/02325* (2021.01); *H01S 5/02345* (2021.01); *H01S 5/0236* (2021.01); *H01S 5/0238* (2021.01); *H10F 39/024* (2025.01); *B32B 2457/14* (2013.01); *B32B 2551/00* (2013.01); *H01S 5/183* (2013.01)

(58) Field of Classification Search
CPC ............ H01S 5/02253; H01S 5/02325; H01S 5/0236; H01S 5/183; H01S 5/423; H10F 39/806; B32B 2551/00; B32B 7/12
See application file for complete search history.

(56) References Cited

U.S. PATENT DOCUMENTS 7,763,841 B1 *  7/2010  McEldowney .... G02B 27/4272
                                                  348/340
9,711,562 B2    7/2017  Lin et al.
(Continued)

*Primary Examiner* — Jaehwan Oh
(74) *Attorney, Agent, or Firm* — HAYNES AND BOONE, LLP

(57) ABSTRACT

Optical modules and methods of forming the same are provided. In an embodiment, an exemplary method includes forming multiple first optical elements over a first wafer, forming multiple second optical elements over a second wafer, forming multiple third optical elements over a third wafer, aligning the first wafer with the second wafer such that, upon the aligning of the first wafer with the second wafer, each first optical element is vertically overlapped with a corresponding second optical element. The method also includes bonding the first wafer with the second wafer to form a first bonded structure, aligning the second wafer with the third wafer such that, and upon bonding the second wafer of the first bonded structure to the third wafer, where upon the aligning of the second wafer with the third wafer, each second optical element is vertically overlapped with a corresponding third optical element.

20 Claims, 18 Drawing Sheets

(51) Int. Cl.
*B32B 37/12* (2006.01)
*B32B 38/00* (2006.01)
*H01S 5/02325* (2021.01)
*H01S 5/02345* (2021.01)
*H01S 5/0236* (2021.01)
*H01S 5/0238* (2021.01)
*H10F 39/00* (2025.01)
*H01S 5/183* (2006.01)

(56) References Cited

U.S. PATENT DOCUMENTS

| | | | |
|---|---|---|---|
| 9,786,820 B2* | 10/2017 | Rudmann | H10F 77/413 |
| 10,866,361 B2 | 12/2020 | Lai et al. | |
| 2006/0261252 A1* | 11/2006 | Cole | H10F 77/331 |
| | | | 250/226 |
| 2009/0316273 A1* | 12/2009 | Viens | G02B 3/0062 |
| | | | 359/619 |
| 2014/0183611 A1 | 7/2014 | Chang et al. | |
| 2018/0196170 A1* | 7/2018 | Tazawa | B29D 11/00375 |
| 2020/0127438 A1* | 4/2020 | Bovington | H01S 5/0215 |

\* cited by examiner

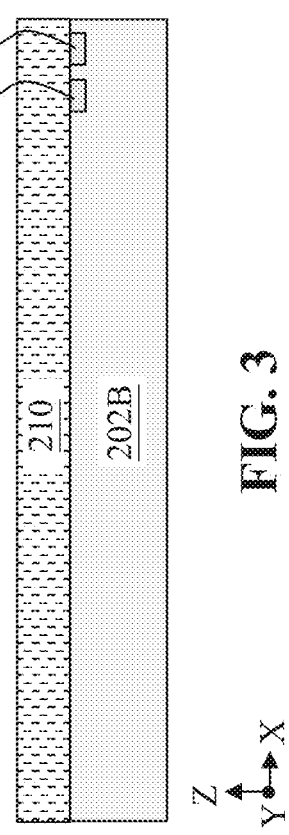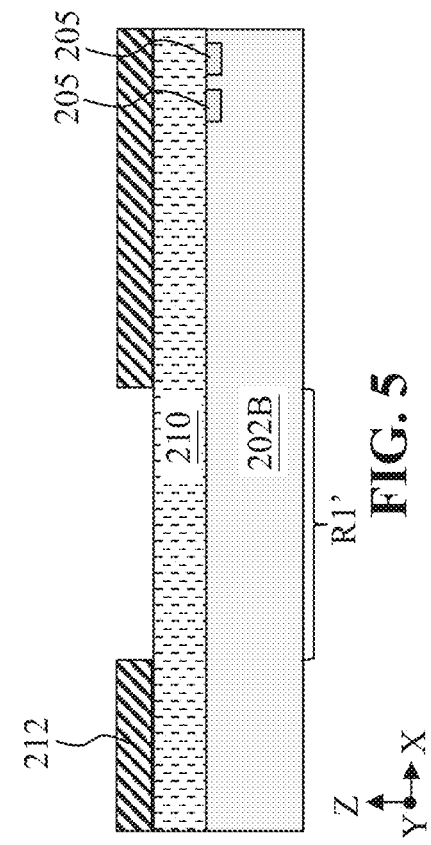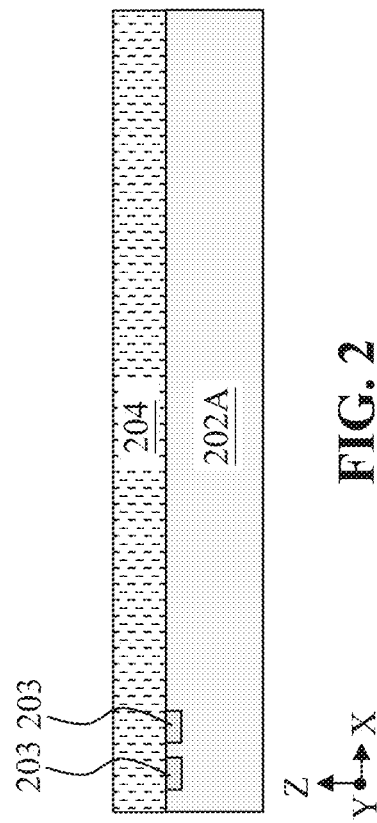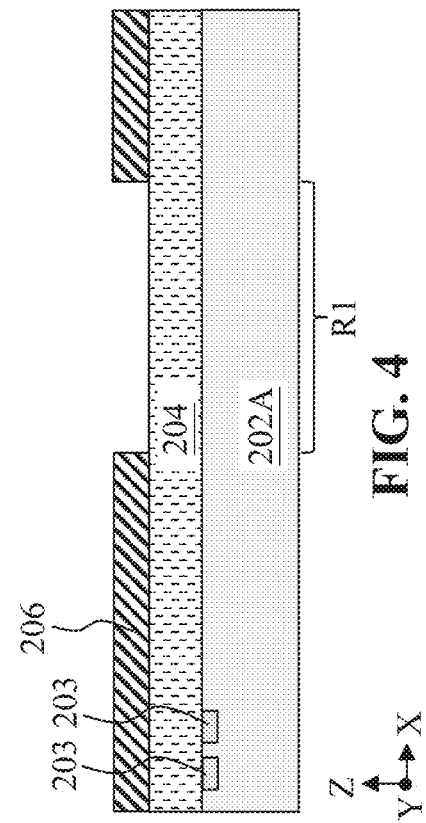

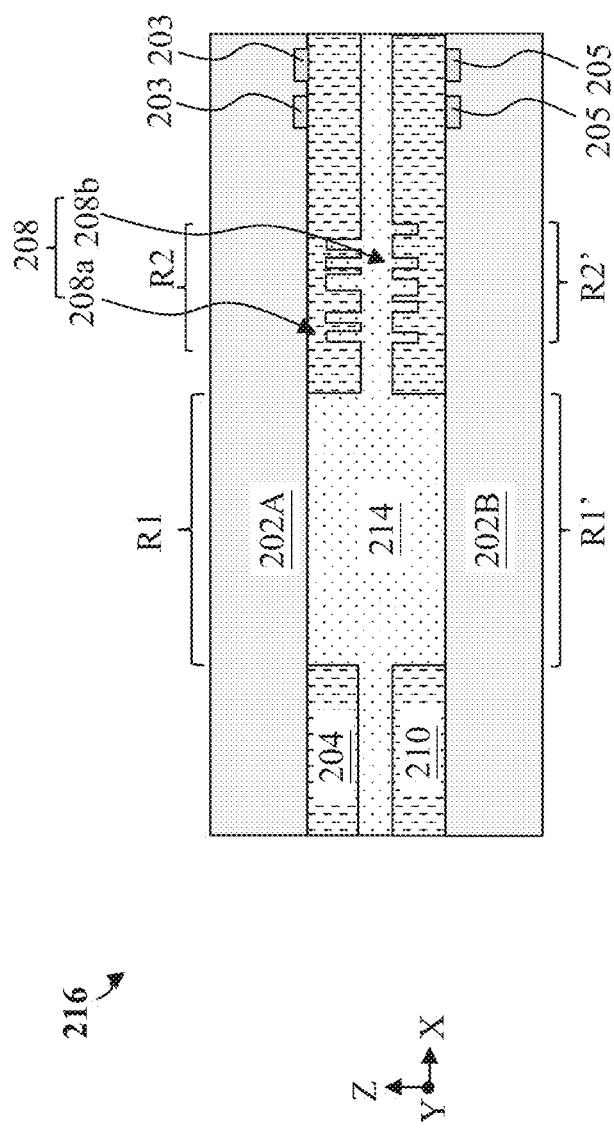
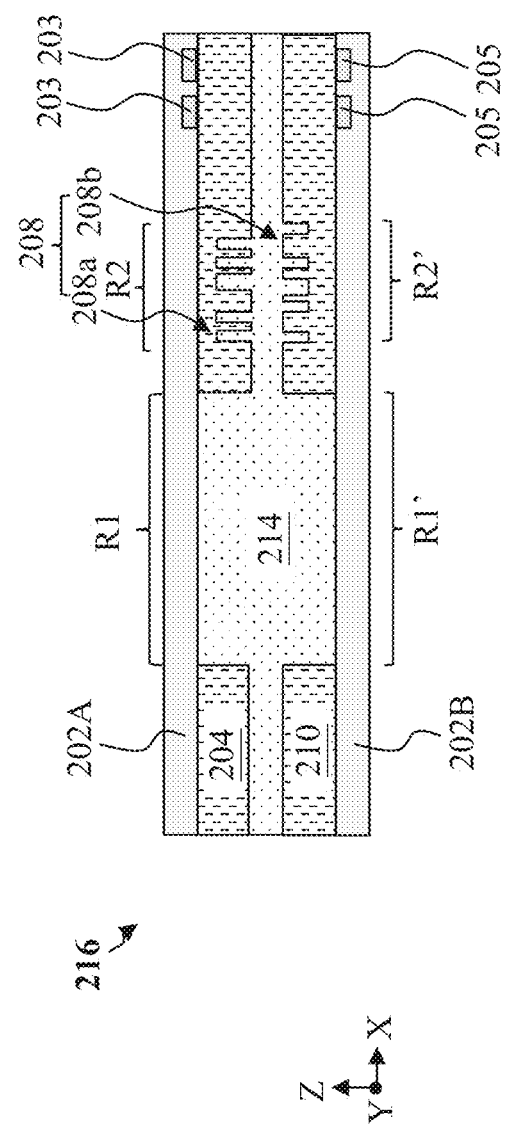
FIG. 10
FIG. 11

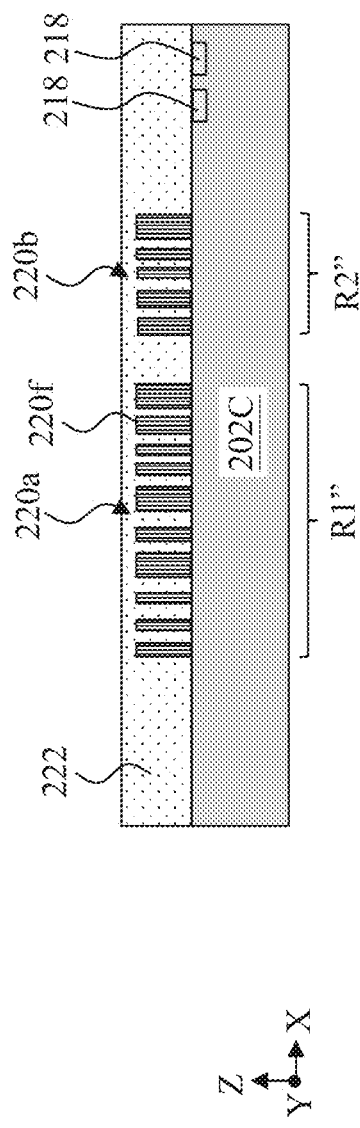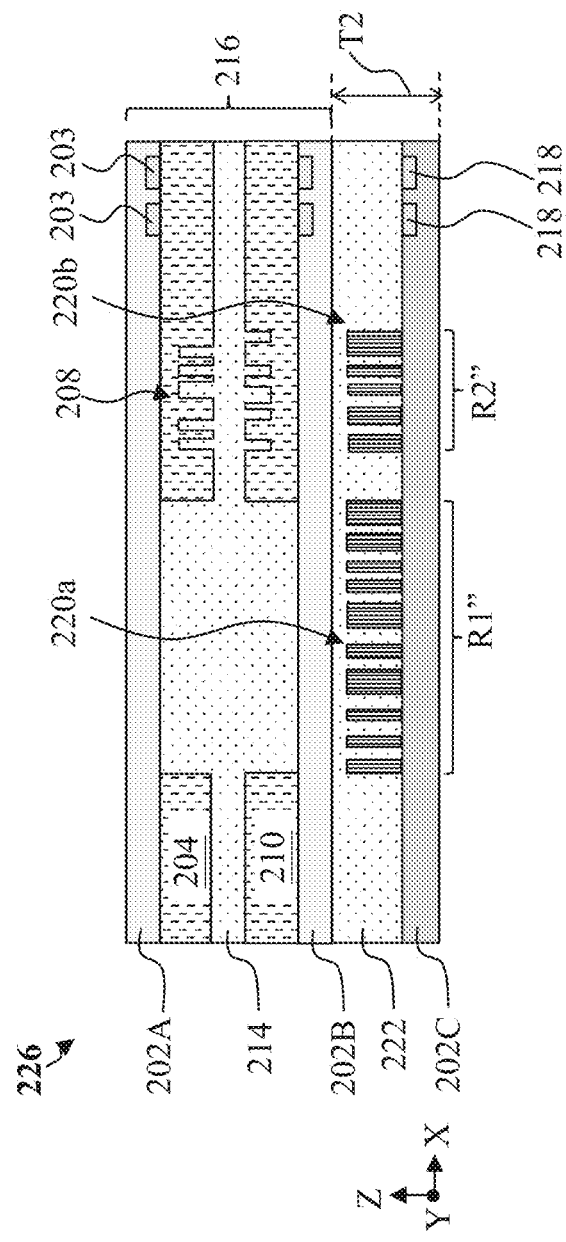

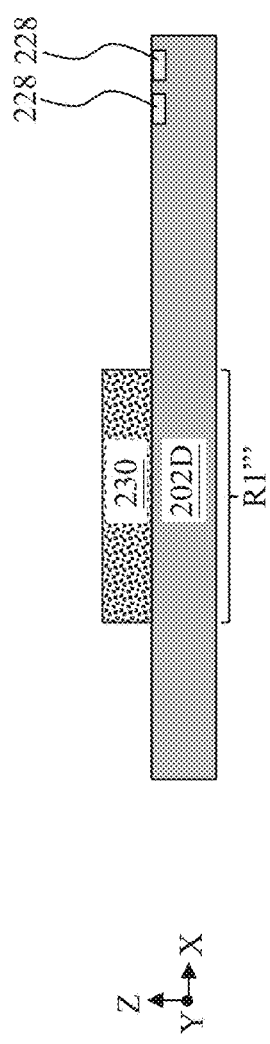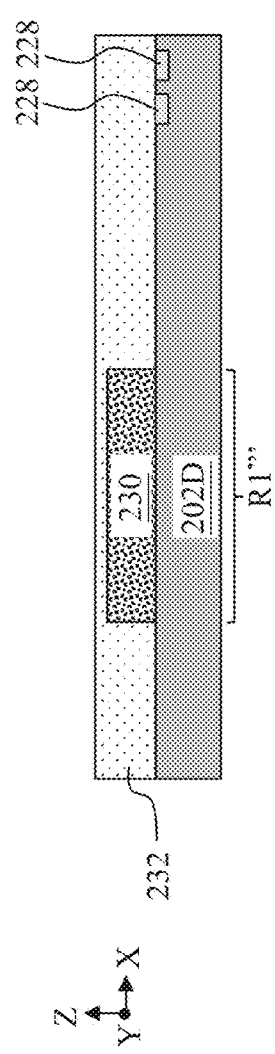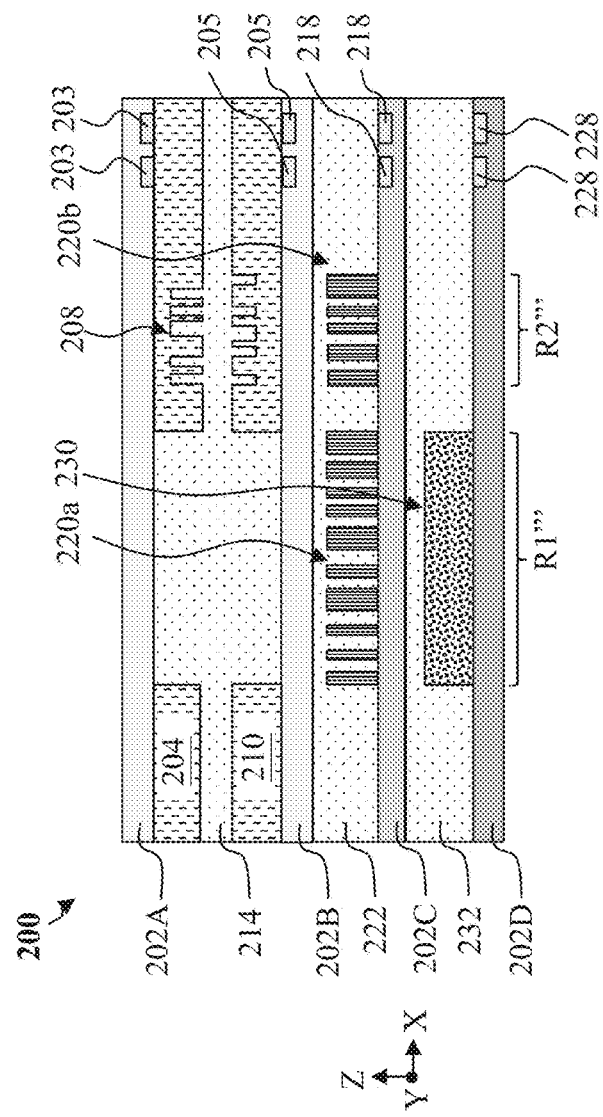

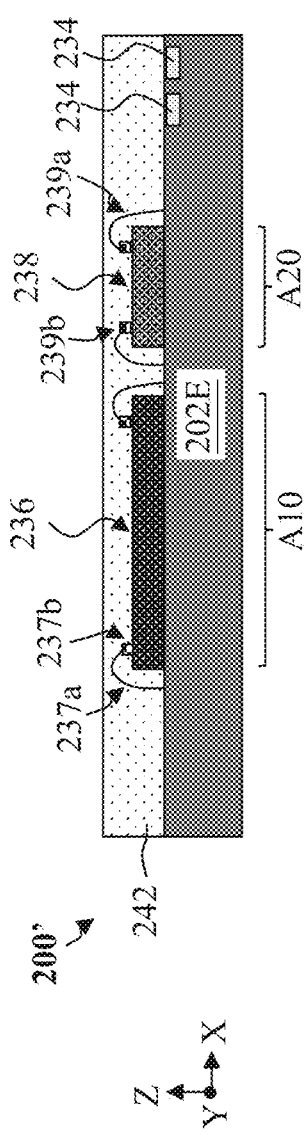
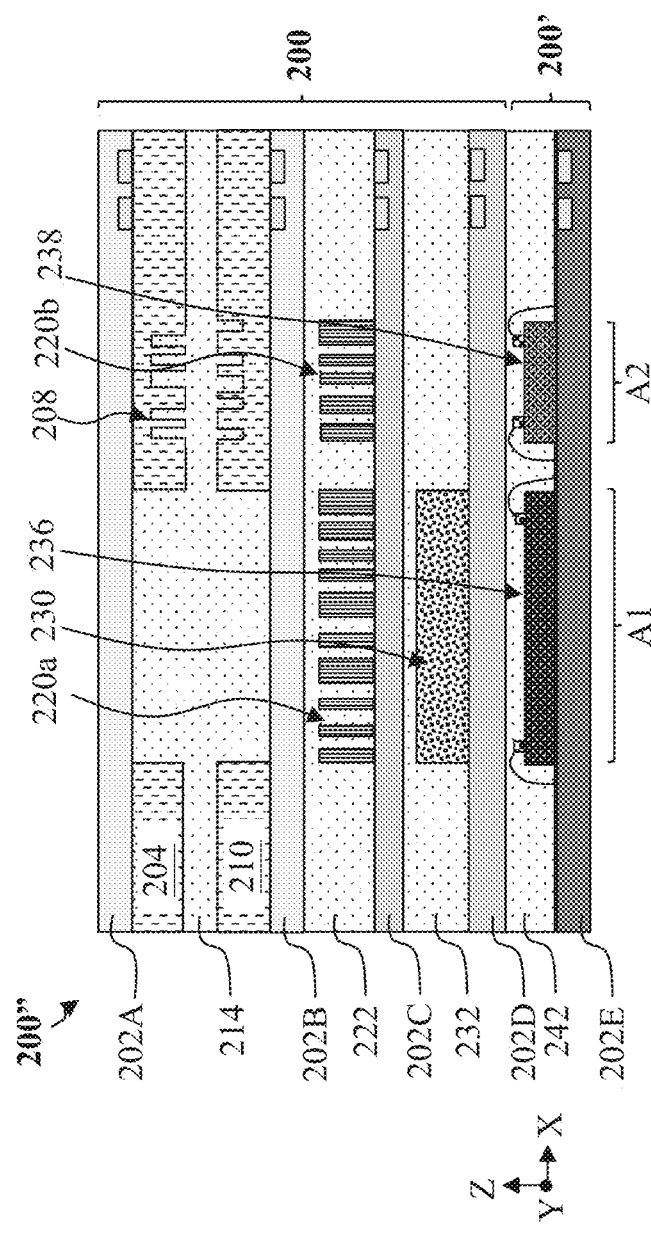

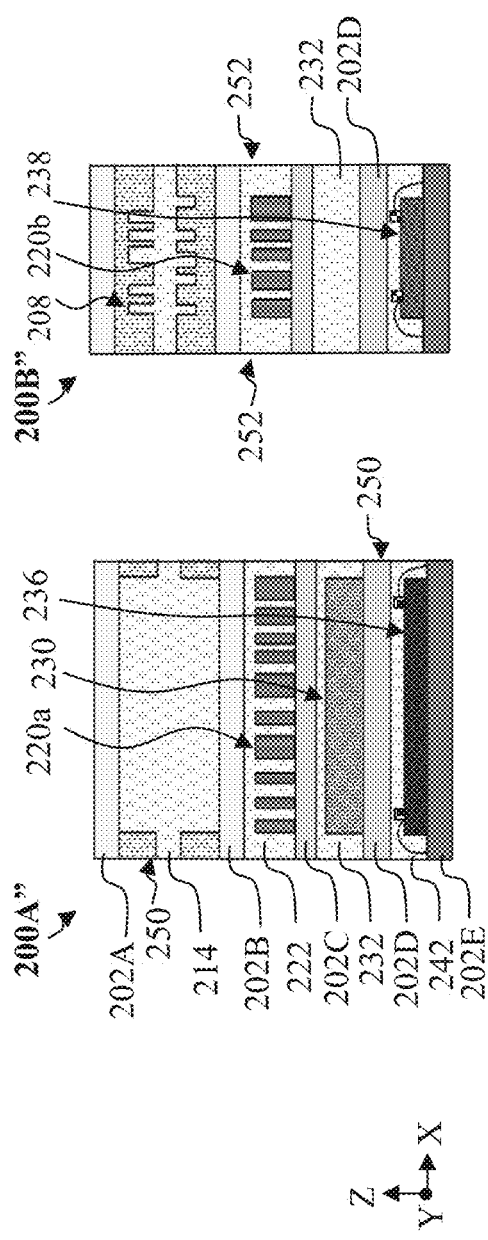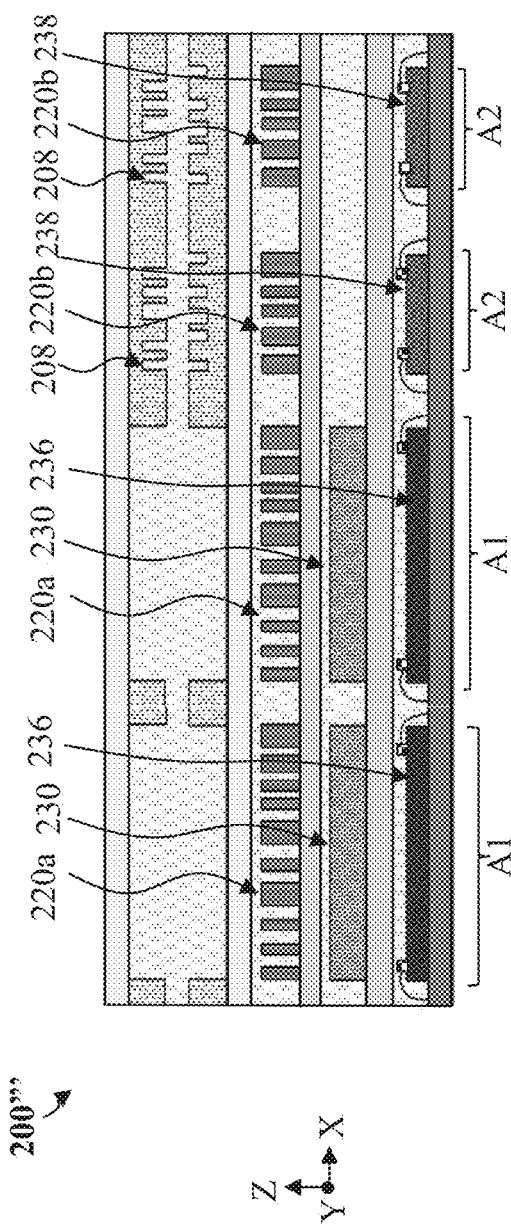

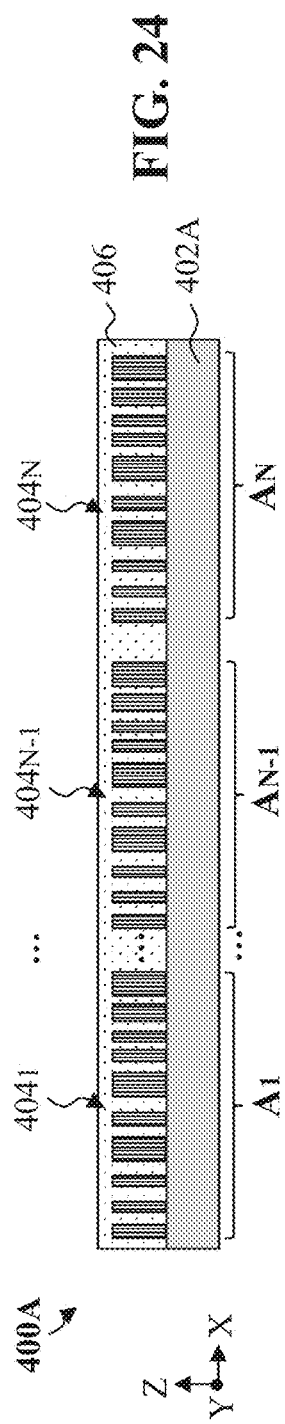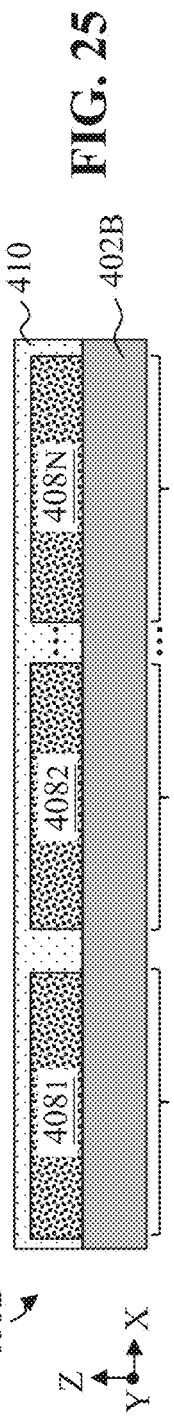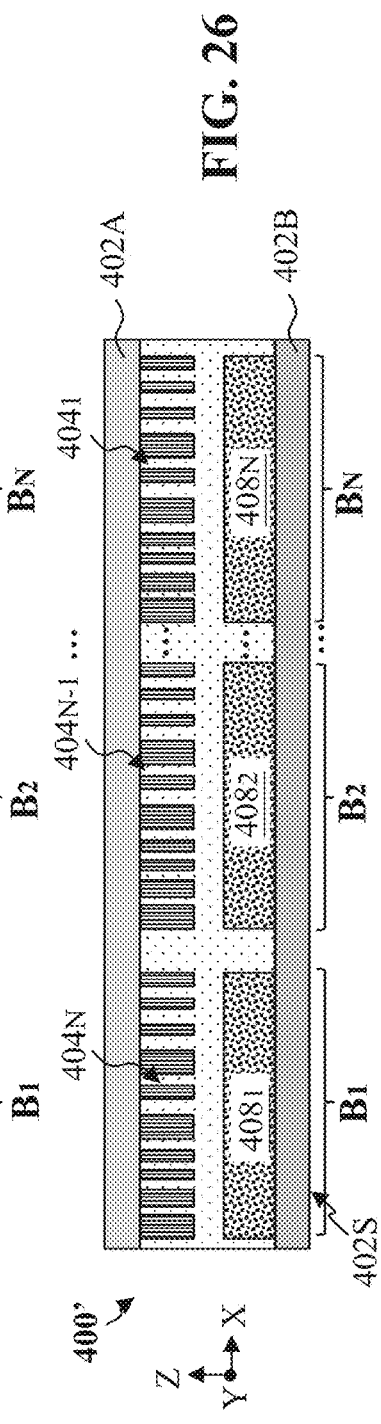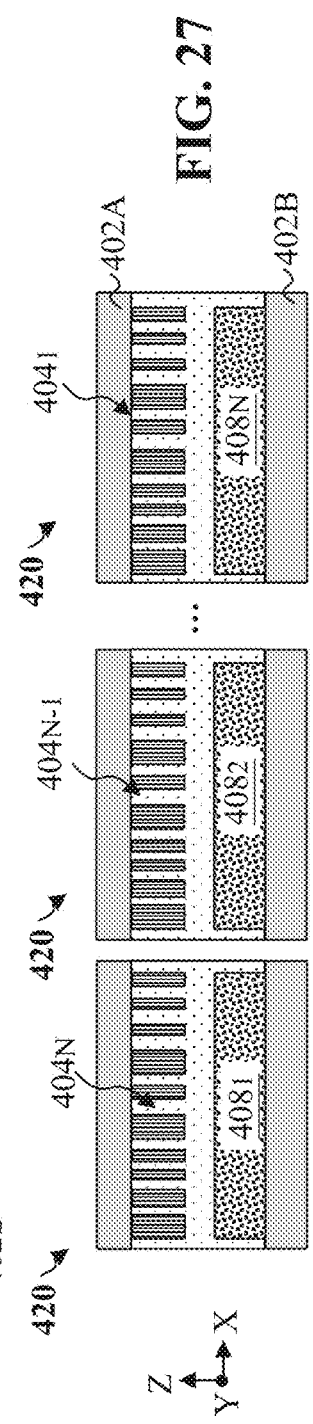

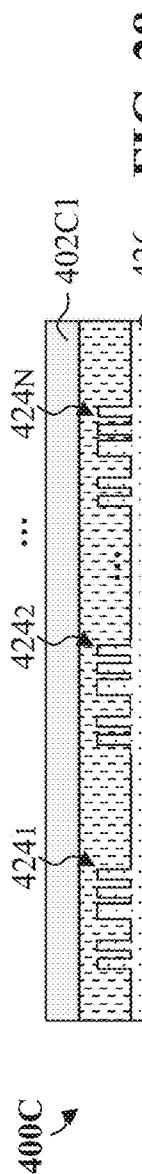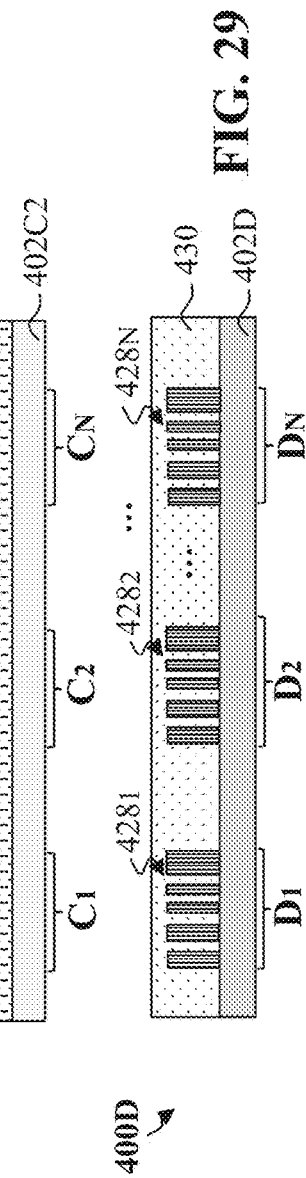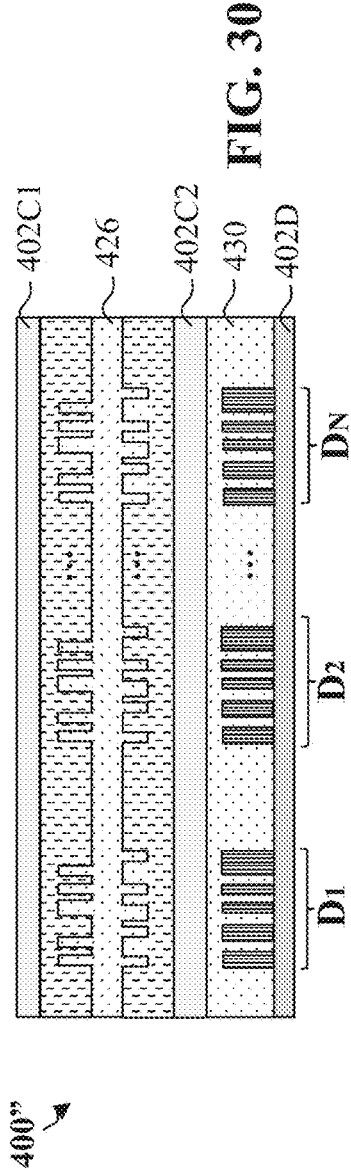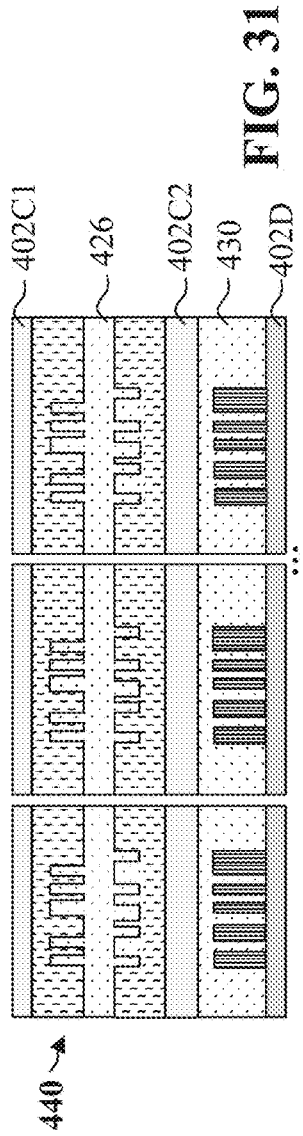

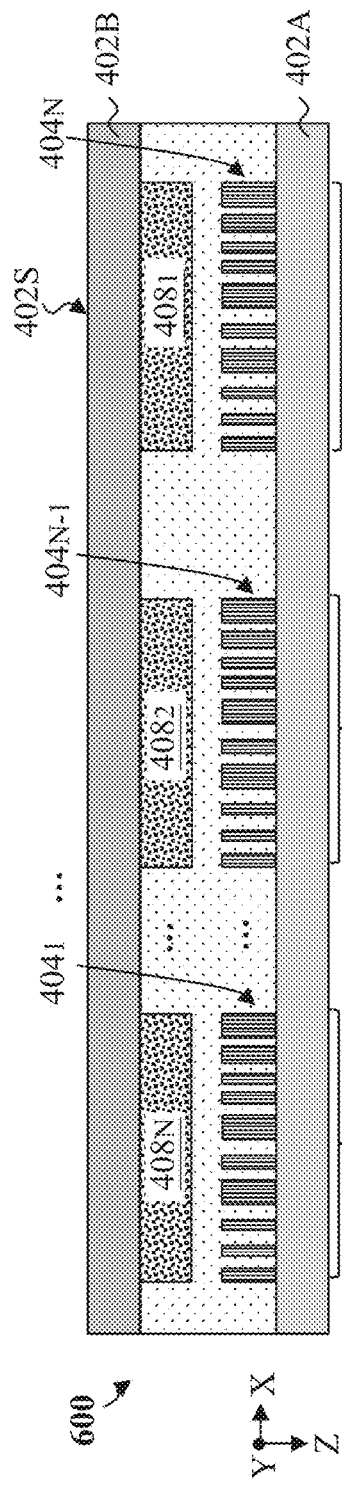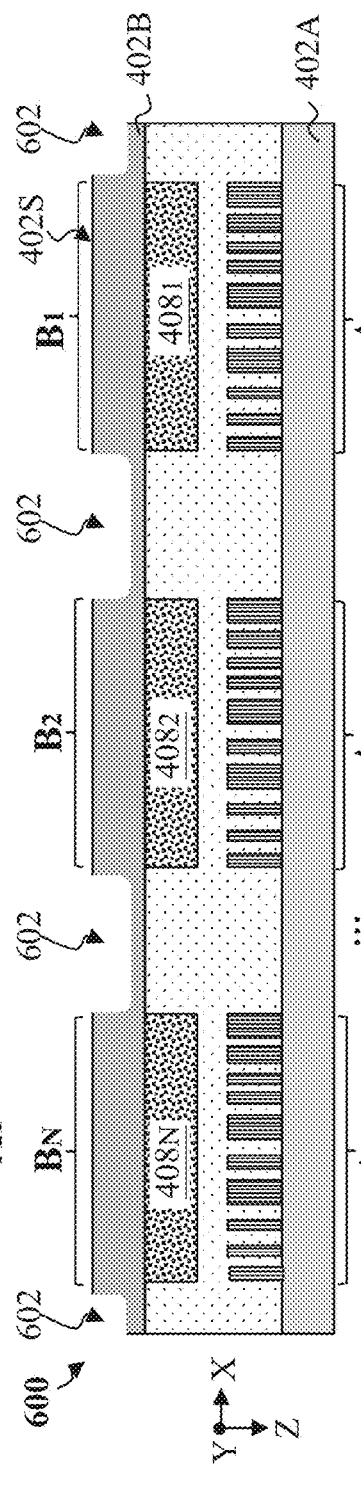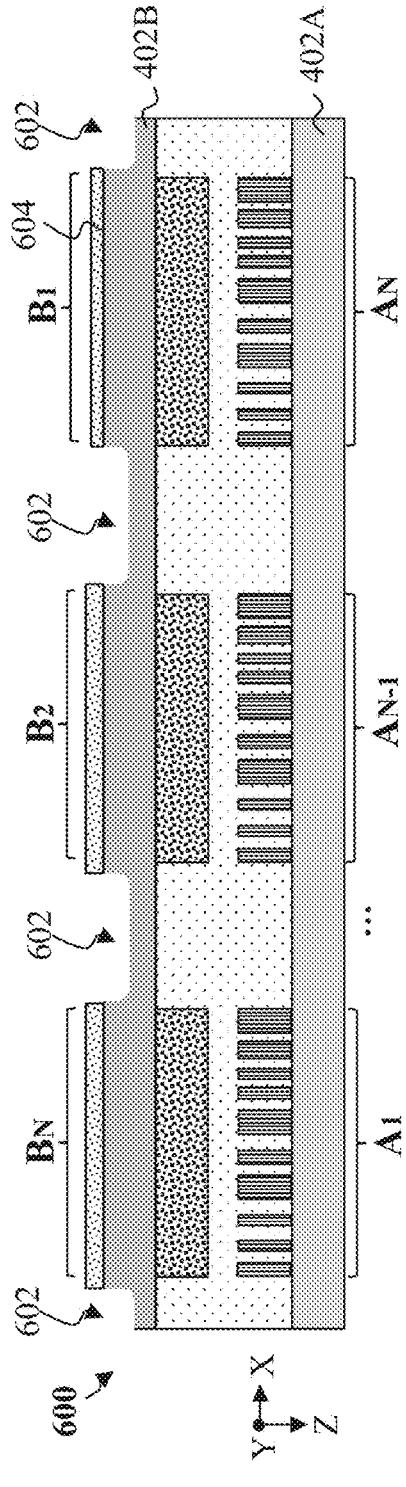

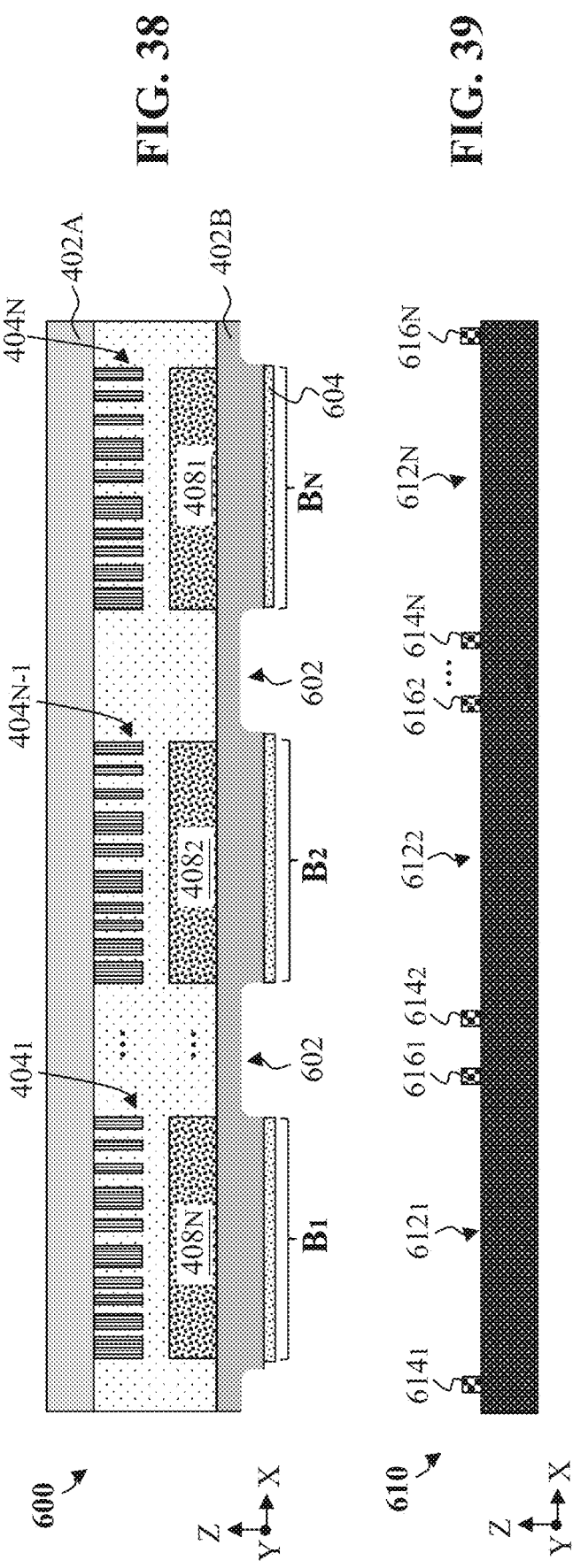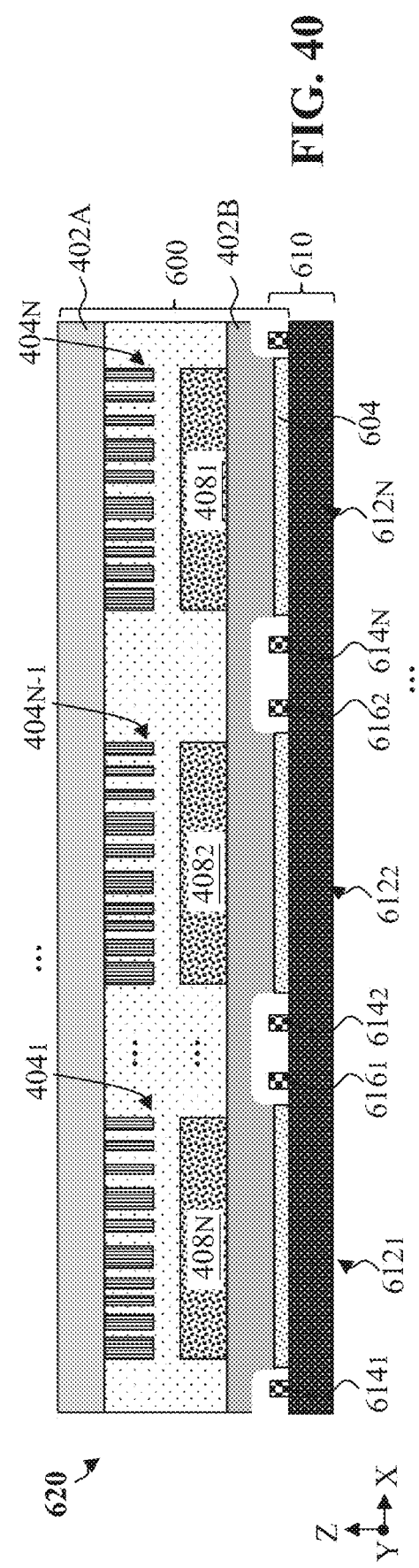

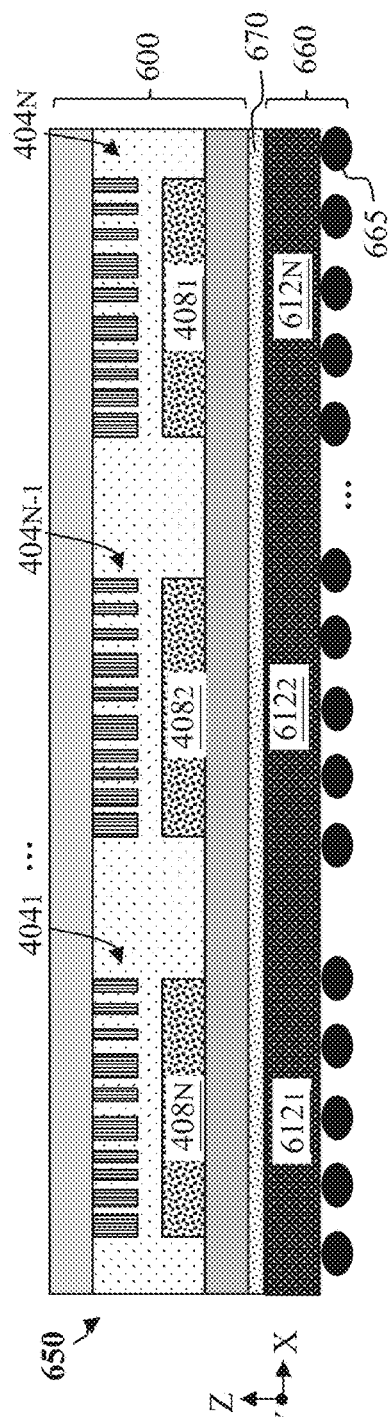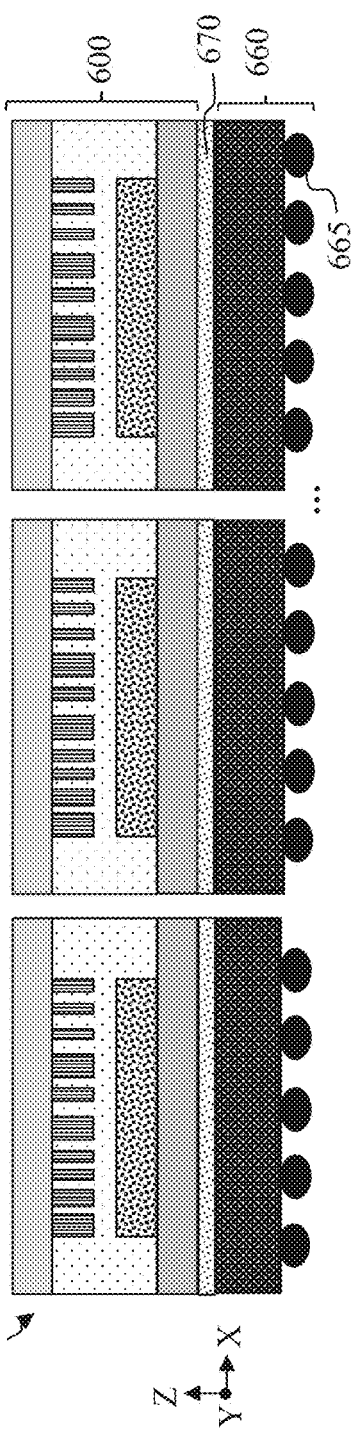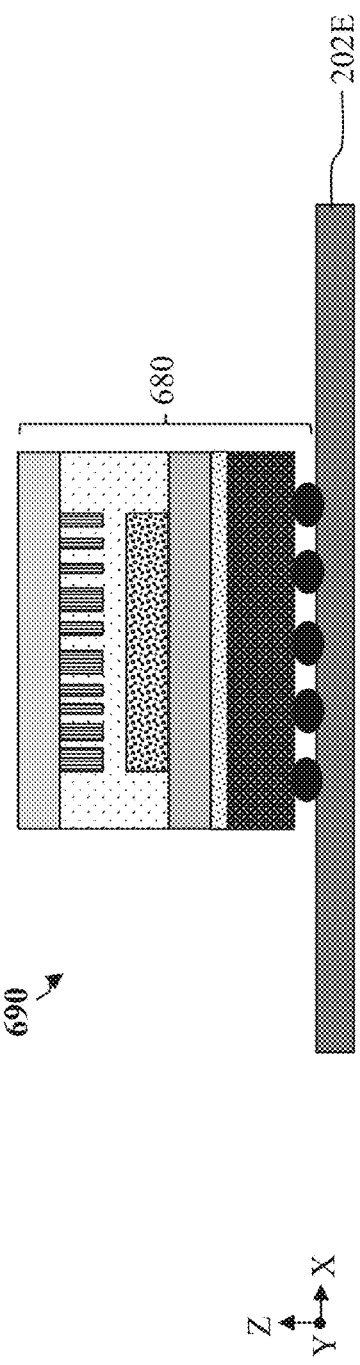

METHODS OF FORMING OPTICAL MODULES

PRIORITY DATA

The present application claims the benefit of U.S. Provisional Application No. 63/324,734, entitled "Methods of Forming Optical Modules," filed Mar. 29, 2022, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected modules per chip area) has generally increased while geometry size (i.e., the smallest component (or line) that can be created using a fabrication process) has decreased. This scaling down process generally provides benefits by increasing production efficiency and lowering associated costs.

Despite the advances made in semiconductor fabrication, existing methods of forming optical modules may still require improvements. For example, each optical module may be formed by aligning and assembling multiple individual optical elements, resulting in bulky optical modules, complicated module assembly processes, and increased cost. Therefore, although existing methods of forming optical modules have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8, 9, 10, 11, 12, 13, 14, 15, 16, 17, 18, 19, 20, 21, and 22 illustrate fragmentary cross-sectional views of workpieces during various fabrication stages in the method of FIG. 1, according to one or more aspects of the present disclosure.

FIGS. 24, 25, 26, 27, 28, 29, 30, 31, 32, and 33 illustrate fragmentary cross-sectional views of workpieces during various fabrication stages in the method of FIG. 23, according to one or more aspects of the present disclosure.

FIGS. 35, 36, 37, 38, 39, 40, 41, 42, and 43 illustrate fragmentary cross-sectional views of workpieces during various fabrication stages in the method of FIG. 34, according to one or more aspects of the present disclosure.

FIGS. 44, 45, and 46 illustrate fragmentary cross-sectional views of alternative workpieces during various fabrication stages, according to one or more aspects of the present disclosure.

DETAILED DESCRIPTION

Figure 1:
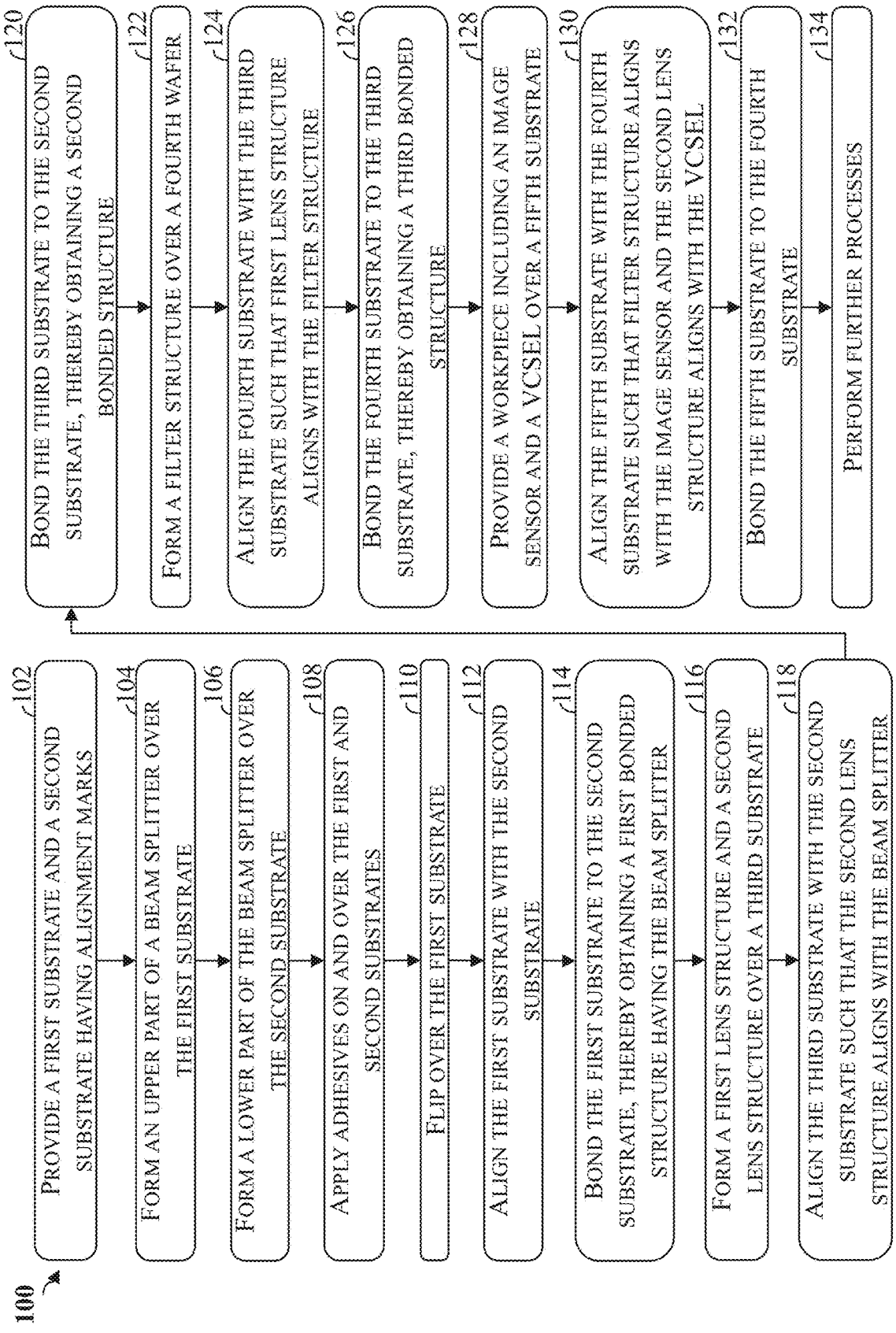
FIG. 1 illustrates a flow chart of a method for simultaneously forming a number of first optical modules and a number of second optical modules, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Optical modules are widely implemented in various devices such as infrared cameras and dot projectors. Some optical modules may include multiple optical elements. In some existing technologies, each optical element may be individually fabricated, and those optical elements may be then aligned and assembled to form one optical module. The optical module may be bulky. Also, forming multiple optical modules involves bulky and complicated assembly processes, which disadvantageously increases associated cost and decreases productivity.

The present disclosure provides methods for forming optical modules. In an exemplary method, each type of optical elements may be fabricated on one or more wafers. For example, a number of lens structures may be fabricated on a first wafer, and a number of filter structures may be fabricated on a second wafer. After fabricating different optical elements on those wafers, wafer-level alignments and bonding processes may be then performed. Upon the alignment and bonding of those wafers, optical elements formed on those wafers may be aligned accordingly. A singulation process may be then followed to dice the bonded wafers into multiple optical modules. By fabricating those optical elements using semiconductor-comparable processes, optical modules with reduced dimensions may be achieved. In addition, by avoiding performing repeated alignment processes for each single optical module, performing wafer-level alignments may increase the overall productivity and reduce associated cost.

Figure 23:
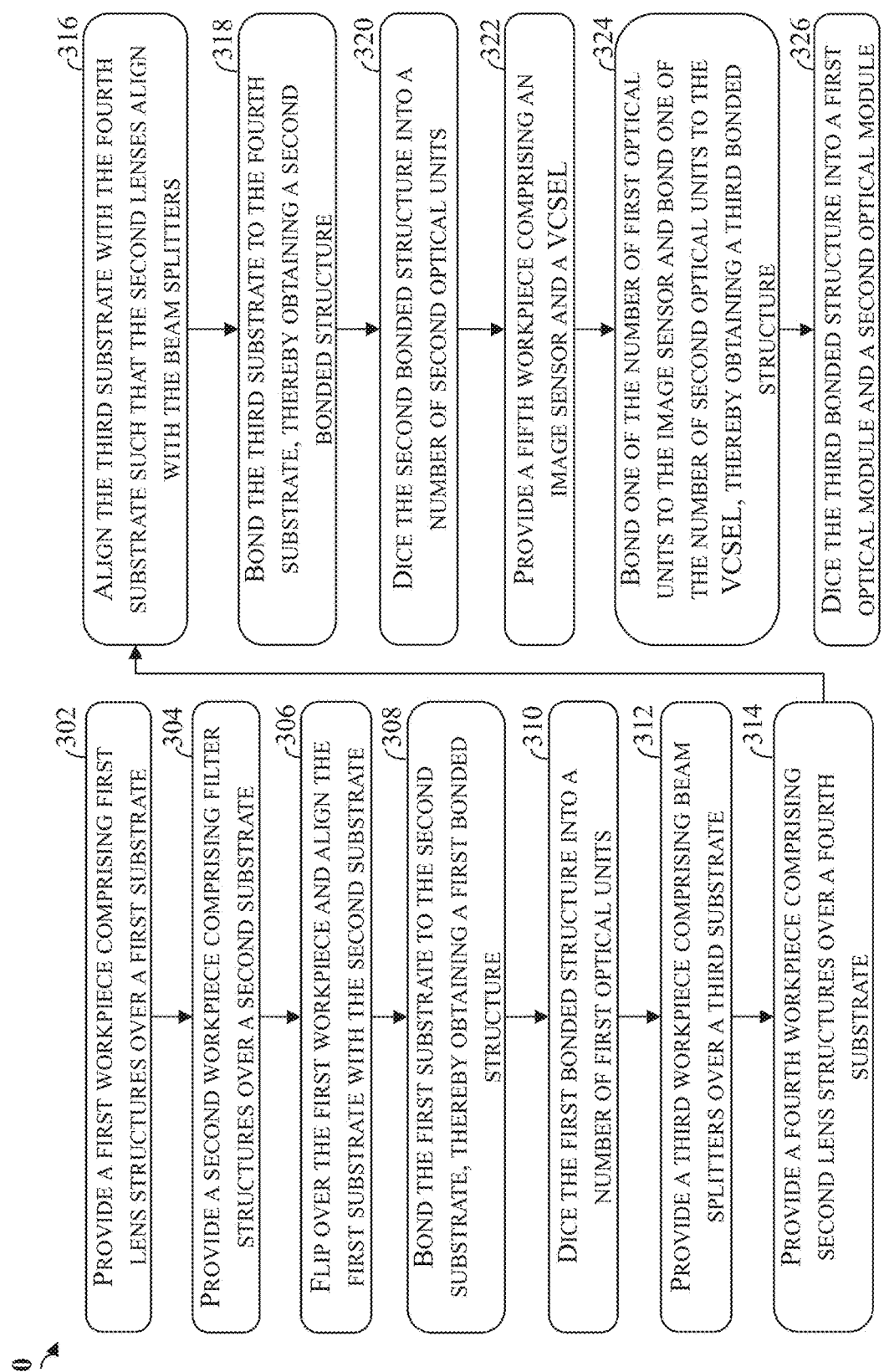
FIG. 23 illustrates a flow chart of a first alternative method for forming a number of first optical modules and a number of second optical modules, according to one or more aspects of the present disclosure.

The various aspects of the present disclosure will now be described in more detail with reference to the figures. In that regard, FIG. 1 is a flowchart illustrating method 100 of forming a number of first optical modules and a number of second optical modules, according to embodiments of the present disclosure. Method 100 is described below in conjunction with FIGS. 2-22, which are fragmentary cross-sectional views of workpieces at different stages of fabrication according to embodiments of method 100. FIG. 23 is a flowchart illustrating exemplary operations in an alternative method 300 of forming a number of first optical modules and a number of second optical modules, according to embodiments of the present disclosure. Method 300 is described below in conjunction with FIGS. 24-33, which are fragmentary cross-sectional views of workpieces at different stages of fabrication according to embodiments of method 300. FIG. 34 is a flowchart illustrating exemplary operations in another alternative method 500 of forming a number of first optical modules, according to embodiments of the present disclosure. Method 500 is described below in conjunction with FIGS. 35-46, which are fragmentary cross-sectional views of workpieces at different stages of fabrication according to embodiments of method 500. Methods 100, 300, and 500 are merely examples and are not intended to limit the present disclosure to what is explicitly illustrated therein. Additional steps may be provided before, during and after the method 100, 300, and/or 500, and some steps described can be replaced, eliminated, or moved around for additional embodiments of the method. Not all steps are described herein in detail for reasons of simplicity. For avoidance of doubts, the X, Y and Z directions in FIGS. 2-22, 24-33, and 35-46 are perpendicular to one another and are used consistently throughout FIGS. 2-22, 24-33, and 35-46. Throughout the present disclosure, like reference numerals denote like features unless otherwise excepted.

Referring to FIGS. 1, 2, and 3, method 100 includes a block 102 where a first substrate 202A and a second substrate 202B are provided. Each of the first substrate 202A (or a first wafer 202A) and the second substrate 202B (or a second wafer 202B) may be formed of quartz, fused silica, sapphire or other suitable materials that are transparent to the wavelength of light of interest. In some embodiments, each of the first substrate 202A and the second substrate 202B includes a number of alignment marks. For example, the first substrate 202A includes two alignment marks 203, and the second substrate 202B includes two alignment marks 205. It is understood that the arrangement (e.g., position, shape, size) and number of the alignment marks 203/205 represented in FIGS. 2 and 3 are just an example. Other arrangements and number (e.g., 3 or more) are possible. In the present embodiments, a size and a shape of a top view of the first substrate 202A are the same as a size and a shape of a top view of the second substrate 202B.

Referring to FIGS. 1, 2, 4, and 6, method 100 includes a block 104 where an upper part 208a of a beam splitter 208 is formed over the first substrate 202A. With reference to FIG. 2, a first material layer 204 is disposed on the first substrate 202A. The first material layer 204 may be formed on the first substrate 202A using atomic layer deposition (ALD), physical vapor deposition (PVD), chemical vapor deposition (CVD), or other suitable methods. The first material layer 204 may include metal (e.g., aluminum), dielectric materials (e.g., silicon nitride) or any other suitable materials.

With reference to FIG. 4, after the formation of the first material layer 204, a mask film is deposited over the first substrate 202A using CVD or ALD and then patterned by a lithography process, thereby forming a patterned mask film 206. An exemplary lithography process includes spin-on coating a photoresist layer, soft baking of the photoresist layer, mask aligning, exposing, post-exposure baking, developing the photoresist layer, rinsing, and drying (e.g., hard baking). The patterned mask film 206 exposes a portion of the first material layer 204 disposed directly over a first region R1 of the first substrate 202A. While using the patterned mask film 206 as an etch mask, an etching process is performed to remove the portion of the first material layer 204 exposed by the patterned mask film 206. In some embodiments, the first region R1 of the first substrate 202A may be determined based on configurations of other optical elements (e.g., image sensor 236 shown in FIG. 19) and a positional relationship between the other optical elements and the respective alignment marks. The patterned mask film 206 may be then selectively removed.

Figure 6:
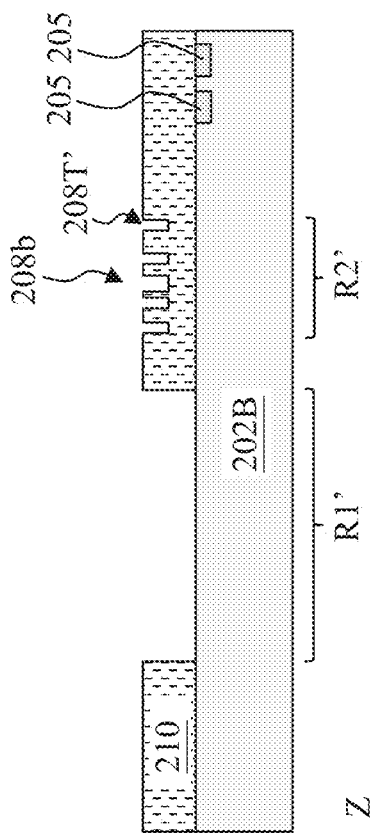

With reference to FIG. 6, after removing the patterned mask film 206, further processes such as lithography and etching may be performed to the remaining portion of the first material layer 204 to form an upper part 208a of a beam splitter 208 (shown in FIG. 10) directly over a second region R2 of the first substrate 202A. The upper part 208a of the beam splitter 208 may include trenches (e.g., trench 208T) formed in the first material layer 204. It is understood that the shape of a cross-sectional view of the upper part 208a of the beam splitter 208 shown in FIG. 6 is just an example and is not intended to limit the present disclosure to what is explicitly illustrated therein.

Referring to FIGS. 1, 3, 5, 7, method 100 includes a block 106 where a lower part 208b of the beam splitter 208 is formed over the second substrate 202B. With reference to FIG. 3, a second material layer 210 is disposed on the second substrate 202B. The composition and formation of the second material layer 210 may be similar to those of the first material layer 204. In an embodiment, a composition of the second material layer 210 is the same as a composition of the first material layer 204.

After the formation of the second material layer 210, in embodiments represented in FIG. 5, a patterned mask film 212 is formed over the second material layer 210. The patterned mask film 212 exposes a portion of the second material layer 210 disposed directly over a first region R1' of the second substrate 202B. The formation of the patterned mask film 212 may be similar to the formation of the patterned mask film 206. An etching process may be followed to remove the portion of the second material layer 210 disposed directly over the first region R1' of the second substrate 202B. The patterned mask film 212 may be then selectively removed. In the present embodiment, a dimension and a shape of a top view of the first region R1' of the second substrate 202B are substantially the same as dimension and a shape of a top view of the first region R1 of the first substrate 202A, and a positional relationship between the first region R1' of the second substrate 202B and the alignment marks 205 corresponds to a positional relationship between the first region R1 of the first substrate 202A and the alignment marks 203 such that, when the first substrate 202A is flipped over and aligned with the second substrate 202B, the first region R1 of the first substrate 202A would align with the first region R1' of the second substrate 202B. That is, after the first substrate 202A is flipped over and aligned with the second substrate 202B, boundaries and central lines of the first region R1 of the first substrate 202A and the first region R1' of the second substrate 202B are aligned.

Figure 7:
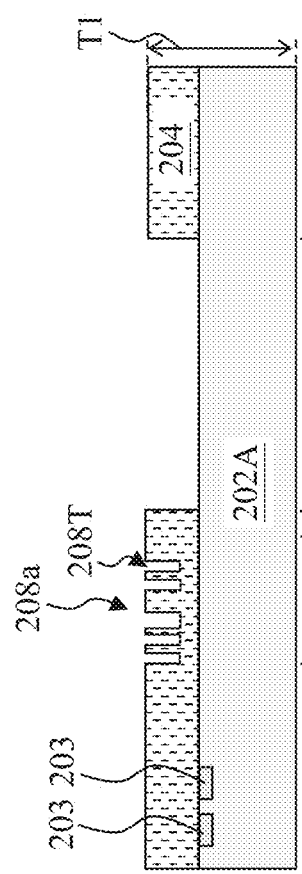

With reference to FIG. 7, after removing the patterned mask film 212, further processes such as lithography and etching may be performed to the remaining portion of the second material layer 210 to form a lower part 208b of the beam splitter 208 (shown in FIG. 10) directly over a second region R2' of the second substrate 202B. The lower part 208b of the beam splitter 208 may include trenches (such as trench 208T'). It is understood that the shape of a cross-sectional view of the lower part 208b of the beam splitter 208 shown in FIG. 7 is just an example and is not intended to limit the present disclosure to what is explicitly illustrated therein. Position and configuration of the lower part 208b of the beam splitter 208 formed over the second substrate 202B may be determined based on a desired position and configuration of the beam splitter 208 and the corresponding position and configuration of the upper part 208a of the beam splitter 208 formed over the first substrate 202A. In the present embodiments, the second region R2' of the second substrate 202B is determined such that, when the first substrate 202A is flipped over and aligned with the second substrate 202B, a combination of the upper part 208a of the beam splitter 208 formed over the first substrate 202A and the lower part 208b of the beam splitter 208 formed over the second substrate 202B would form the beam splitter 208 with satisfactory optical function(s).

Figure 8:
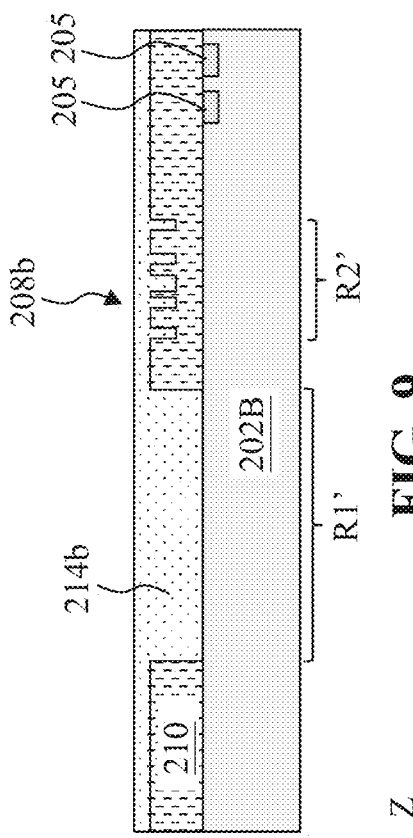
Figure 9:
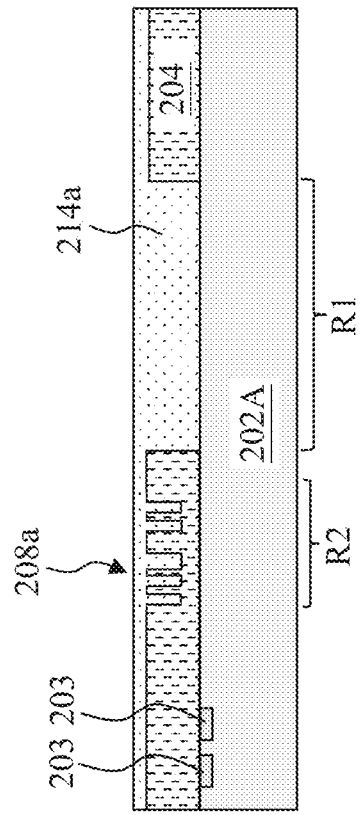

Referring to FIGS. 1, 8, and 9, method 100 includes a block 108 where a first adhesion layer 214a is formed over the first substrate 202A and a second adhesion layer 214b is formed over the second substrate 202B. The first adhesion layer 214a and the second adhesion layer 214b are configured to facilitate the bonding between the first substrate 202A and the second substrate 202B. In the present embodiments, the first adhesion layer 214a is not only formed on and around the upper part 208a of the beam splitter 208, but also fills the trenches (e.g., trench 208T) of the upper part 208a of the beam splitter 208. The first adhesion layer 214a is also formed directly on the first region R1 of the first substrate 202A. The second adhesion layer 214b is not only formed on and around the lower part 208b of the beam splitter 208, but also fills the trenches (e.g., trench 208T') of the lower part 208b of the beam splitter 208. The second adhesion layer 214b is also formed directly on the first region R1' of the second substrate 202B. The first adhesion layer 214a and the second adhesion layer 214b may include any suitable material with a low optical absorption coefficient (or absorptivity) such as benzocyclobutene (BCB) polymer and may be deposited using any suitable method. The first adhesion layer 214a may be formed before or after the formation of the second adhesion layer 214b. In some other embodiments, the first adhesion layer 214a and the second adhesion layer 214b may be formed simultaneously.

Referring to FIGS. 1 and 10, method 100 includes a block 110 where the first substrate 202A is flipped over. After the workpiece shown in FIG. 8 is flipped over, as represented in FIG. 10, the first substrate 202A is at the top and is disposed over the first material layer 204 (including the upper part 208a of the beam splitter 208).

Referring to FIGS. 1 and 10, method 100 includes a block 112 where the first substrate 202A is aligned with the second substrate 202B. As described above with reference to FIGS. 2-3, the first substrate 202A includes alignment marks 203 and the second substrate 202B includes alignment marks 205. In the illustrated embodiment, after the first substrate 202A is flipped over, the second substrate 202B may be moved laterally until each of the alignment marks 205 in the second substrate 202B is aligned with a corresponding alignment mark 203 in the first substrate 202A. That is, a wafer-level alignment process is performed to align the second substrate 202B with the first substrate 202A. In the present embodiments, after the first substrate 202A is flipped over and aligned with the second substrate 202B, the first region R1 of the first substrate 202A aligns with the first region R1' of the second substrate 202B, and the second region R2 of the first substrate 202A aligns with the second region R2' of the second substrate 202B. Since the alignment process is a wafer-level alignment process, a higher alignment accuracy may be achieved. In an embodiment, upon the alignment between the first substrate 202A and the second substrate 202B, a distance between a center line of the first region R1 of the first substrate 202A and a center line of the first region R1' of the second substrate 202B may be less than 10 μm. In some embodiments, there is substantially no offset between the center line of the first region R1 and the center line of the first region R1'. The same is true for the second region R2 and the second region R2'.

Referring to FIGS. 1 and 10, method 100 includes a block 114 where the first substrate 202A is bonded to the second substrate 202B. After the first substrate 202A is aligned with the second substrate 202B, the first adhesion layer 214a directly faces the second adhesion layer 214b. In the present embodiments, a composition of the first adhesion layer 214a is the same as a composition of the second adhesion layer 214b, and the first adhesion layer 214a and the second adhesion layer 214b may be separately or collectively referred to as an adhesion layer 214 (shown in FIG. 10). In some embodiments, the first substrate 202A is bonded to the second substrate 202B via a thermocompression bonding process (e.g., including heating and thermal and mechanical pressure) or other suitable bonding processes. After bonding the first substrate 202A to the second substrate 202B, a combination of the upper part 208a of the beam splitter 208 and the lower part 208b of the beam splitter 208 forms the beam splitter 208. In the illustrated embodiment represented in FIG. 10, the upper part 208a of the beam splitter 208 is vertically spaced apart from the lower part 208b of the beam splitter 208 by a combination of the first adhesion layer 214a and the second adhesion layer 214b. The workpiece shown in FIG. 10 may be referred to a structure 216.

In some embodiments, as represented in FIG. 11, after the first substrate 202A is bonded to the second substrate 202B, a thinning process may be performed to thin the first substrate 202A and the second substrate 202B from the backside of the first and second substrates to reduce a total thickness of the structure 216. The thinning process may include a mechanical grinding process and/or a chemical thinning process. For example, a substantial amount of substrate material may be first removed from the first substrate 202A during a first mechanical grinding process. Afterwards, a second mechanical grinding process may be applied to the back side of the second substrate 202B to thin the second substrate 202B.

Figure 12:
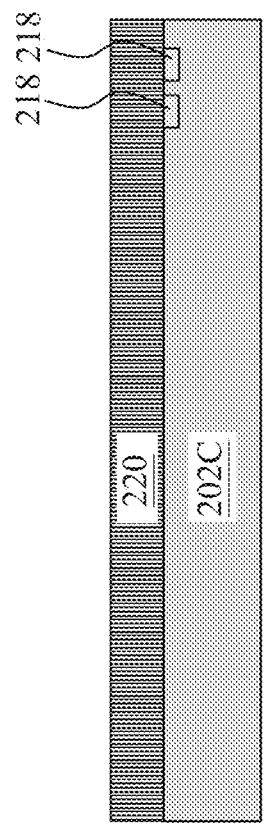
Figure 13:
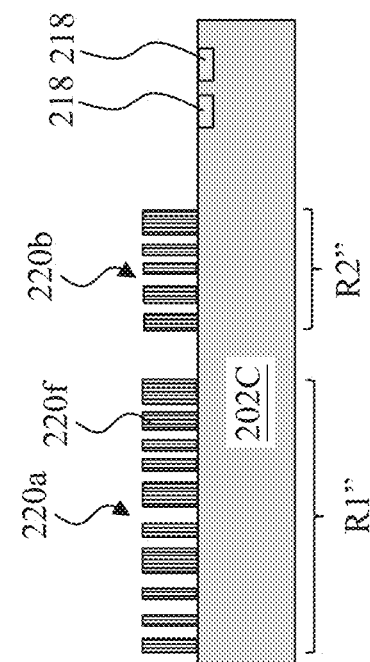

Referring to FIGS. 1, 12, and 13, method 100 includes a block 116 where a first lens structure 220a and a second lens structure 220b are formed over a first predetermined region R1" and a second predetermined region R2" of a third substrate 202C, respectively. The third substrate 202C may be formed of quartz, fused silica, sapphire or other suitable materials that are transparent to the wavelength of light of interest. The third substrate 202C also includes a number of (e.g., two) alignment marks 218. It is understood that the arrangement (e.g., position, shape, size) and number of the alignment marks 218 are just an example. In the present embodiments, a size and a shape of a top view of the third substrate 202C are the same as the size and the shape of a top view of the second substrate 202B. That is, when the third substrate 202C is aligned with the second substrate 202B, boundary (sidewall) and center line of the third substrate 202C are substantially aligned with those of the second substrate 202B.

To form the first lens structure 220a and the second lens structure 220b, with reference to FIG. 12, a third material layer 220 is disposed on the third substrate 202C. The third material layer 220 may be formed on the third substrate 202C using atomic layer deposition (ALD), physical vapor deposition (PVD), chemical vapor deposition (CVD), or other suitable methods. The third material layer 220 may include metal and/or dielectric materials such as titanium dioxide ($TiO_2$), aluminum oxide, hafnium oxide ($HfO_2$), zinc oxide (ZnO), silicon nitride ($Si_3N_4$), other suitable materials, or combinations thereof. After the formation of the third material layer 220, with reference to FIG. 13, one or more lithography processes may be performed to remove excess portions of the third material layer 220 to form the first lens structure 220a directly over a first region R1" of the third substrate 202C and the second lens structure 220b directly over a second region R2" of the third substrate 202C. In an embodiments, both the first lens structure 220a and the second lens structure 220b include a flat lens structure, and each flat lens structure may include a number of fins 220f formed of the third material layer 220. The fins 220f may have different widths along the X direction.

In the present embodiments, a positional relationship between the first region R1" of the third substrate 202C and the respective alignment marks 218 corresponds to a positional relationship between the first region R1' of the second substrate 202B and the alignment marks 205, and a positional relationship between the second region R2" of the third substrate 202C and the alignment marks 218 corresponds to a positional relationship between the second region R2' of the second substrate 202B and the alignment marks 205. Therefore, when the third substrate 202C is aligned with the second substrate 202B, the first region R1" of the third substrate 202C would align with the first region R1' of the second substrate 202B, and the second region R2" of the third substrate 202C would align with the second region R2' of the second substrate 202B.

With reference to FIG. 14, after forming the first lens structure 220a and the second lens structure 220b, a third adhesion layer 222 is formed over the third substrate 202C. In the present embodiments, the third adhesion layer 222 is not only formed on fins 220f of the first and second lens structure 220a and 220b, but also fills trenches between two adjacent fins 220f on the third substrate 202C. The third adhesion layer 222 may include any suitable material with a low optical absorption coefficient (or absorptivity) such as benzocyclobutene (BCB) polymer and may be deposited using any suitable method.

Referring to FIGS. 1 and 15, method 100 includes a block 118 where the third substrate 202C is aligned with the second substrate 202B of the structure 216. As described above, the second substrate 202B includes alignment marks 205 and the third substrate 202C includes alignment marks 218. The third substrate 202C may be moved laterally until each of the alignment marks 218 in the third substrate 202C is aligned with a corresponding alignment mark 205 in the second substrate 202B. That is, a wafer-level alignment process is performed to align the third substrate 202C with the second substrate 202B and a higher alignment accuracy may be achieved. Once the third substrate 202C is aligned with the second substrate 202B, the first region R1" of the third substrate 202C is aligned with the first region R1' of the second substrate 202B, and the second region R2" of the third substrate 202C is aligned with the second region R2' of the second substrate 202B. In other words, the beam splitter 208 is formed directly over the second lens structure 220b. Upon the alignment between the third substrate 202C and the second substrate 202B, a distance between a center line of the beam splitter 208 and a center line of the second lens structure 220b may be less than 10 µm. In an embodiment, there is substantially no offset between the center line of the beam splitter 208 and the center line of the second lens structure 220b.

Referring to FIGS. 1 and 15, method 100 includes a block 120 where the third substrate 202C is bonded to the second substrate 202B of the structure 216. After the third substrate 202C is aligned with the second substrate 202B, the third adhesion layer 222 directly faces a bottom surface of the second substrate 202B. The third substrate 202C may be moved towards the second substrate 202B until the third adhesion layer 222 bonds the third substrate 202C to the bottom surface of the second substrate 202B. In some embodiments, the third substrate 202C is bonded to the second substrate 202B via a thermocompression bonding process or other suitable bonding processes. After bonding the third substrate 202C to the second substrate 202B, in the illustrated embodiment represented in FIG. 15, the beam splitter 208 is formed directly over the second lens structure 220b. After the bonding process, a thinning process (e.g., a mechanical grinding process and/or a chemical thinning process) may be performed to thin the third substrate 202C from the backside. In an embodiment, a thickness T2 of the workpiece that includes the third substrate 202C and the third adhesion layer 222 may be between about 100 µm and about 150 µm. The workpiece shown in FIG. 15 may be referred to a structure 226.

Referring to FIGS. 1 and 16, method 100 includes a block 122 where a filter structure 230 is formed over a region R1'" of a fourth substrate 202D. The fourth substrate 202D may be formed of quartz, fused silica, sapphire or other suitable materials that are transparent to the wavelength of light of interest. The fourth substrate 202D also includes a number of (e.g., two) alignment marks 228. It is understood that the arrangement (e.g., position, shape, size) and number of the alignment marks 228 are just an example. In the present embodiments, a size and a shape of a top view of the fourth substrate 202D are the same as the size and the shape of a top view of the third substrate 202C. That is, when the fourth substrate 202D is aligned with the third substrate 202C, boundary and center line of the fourth substrate 202D are substantially aligned with those of the third substrate 202C. In the present embodiments, a positional relationship between the region R1'" of the fourth substrate 202D and the alignment marks 228 corresponds to a positional relationship between the first region R1" of the third substrate 202C and the alignment marks 218 such that, when the fourth substrate 202D is aligned with the third substrate 202C, the region R1'" of the fourth substrate 202D would align with the first region R1" of the third substrate 202C.

The formation of the filter structure 230 may include depositing a fourth material layer over the fourth substrate 202D and patterning the fourth material layer to form the filter structure 230 directly over the region R1''' of the fourth substrate 202D. The fourth material layer may include a dye-based (or pigment-based) polymer for filtering out a specific frequency band (e.g., desired wavelength of light). Other suitable materials are also possible. In some embodiments, the filter structure 230 may include several filters.

With reference to FIG. 17, after forming the filter structure 230 directly over the region R1''' of the fourth substrate 202D, a fourth adhesion layer 232 is formed over the fourth substrate 202D. In the present embodiments, the fourth adhesion layer 232 is formed on and around the filter structure 230. The fourth adhesion layer 232 may include any suitable material with a low optical absorption coefficient (or absorptivity) such as benzocyclobutene (BCB) polymer and may be deposited using any suitable method.

Referring to FIGS. 1 and 18, method 100 includes a block 124 where the fourth substrate 202D is aligned with the third substrate 202C. As described above, the fourth substrate 202D includes alignment marks 228 and the third substrate 202C includes alignment marks 218. The fourth substrate 202D may be moved laterally until each of the alignment marks 228 in the fourth substrate 202D is aligned with a corresponding alignment mark 218 in the third substrate 202C. That is, a wafer-level alignment process is performed to align the fourth substrate 202D with the third substrate 202C. Thus, a higher alignment accuracy may be achieved. Once the fourth substrate 202D is aligned with the third substrate 202C, the region R1''' of the fourth substrate 202D is aligned with the first region R1'' of the third substrate 202C. In other words, the filter structure 230 is disposed directly under the first lens structure 220a. Upon the alignment between the fourth substrate 202D and the third substrate 202C, a distance between a center line of the filter structure 230 and a center line of the first lens structure 220a may be less than 10 μm. In an embodiment, there is substantially no offset between the center line of the filter structure 230 and the center line of the first lens structure 220a.

Referring to FIGS. 1 and 18, method 100 includes a block 126 where the fourth substrate 202D is bonded to the third substrate 202C. After the fourth substrate 202D is aligned with the third substrate 202C, the fourth adhesion layer 232 directly faces a bottom surface of the third substrate 202C. The fourth substrate 202D may be moved towards the third substrate 202C until the fourth adhesion layer 232 bonds the fourth substrate 202D to the bottom surface of the third substrate 202C. In some embodiments, the fourth substrate 202D is bonded to the third substrate 202C via a thermo-compression bonding process or other suitable bonding processes. After bonding the fourth substrate 202D to the third substrate 202C, in the illustrated embodiment represented in FIG. 18, the first lens structure 220a is formed directly over the filter structure 230 that is disposed directly over the region R1''' of the fourth substrate 202D. The beam splitter 208 is formed directly over the second lens structure 220b, and the second lens structure 220b is formed directly over a region R2''' of the fourth substrate 202D. After the bonding process, a thinning process (e.g., a mechanical grinding process and/or a chemical thinning process) may be performed to thin the fourth substrate 202D from the backside. The workpiece shown in FIG. 18 may be referred to as a workpiece 200.

Referring to FIGS. 1 and 19, method 100 includes a block 128 where a workpiece 200' is provided. In the present embodiments, the workpiece 200' includes a package substrate 202E. The package substrate 202E may be a printed circuit board (PCB) or any other suitable substrates. The workpiece 200' also includes an image sensor 236 formed directly over a first region A10 of the package substrate 202E. In some embodiments, an adhesion layer (not shown) may be used to mount the image sensor 236 to the package substrate 202E. The image sensor 236 is electrically coupled to the package substrate 202E using bonding wires 237a and metal pads 237b. The workpiece 200' also includes a vertical-cavity surface-emitting laser (VCSEL) 238 formed directly over a second region A20 of the package substrate 202E. In some embodiments, an adhesion layer may be used to attach the VCSEL 238 to the package substrate 202E. The VCSEL 238 is electrically coupled to the package substrate 202E using bonding wires 239a and metal pads 239b. The package substrate 202E includes alignment marks 234. The positional relationship among the first region A10 of the package substrate 202E, the image sensor 236, and the alignment marks 234 may be used as a reference to determine the configurations of the first lens structure 220a and the filter structure 230. The positional relationship among the second region A20 of the package substrate 202E, the VCSEL 238, and the alignment marks 234 may be used as a reference to determine the configurations of the second lens structure 220b and beam splitter 208. Therefore, when the alignment marks 234 are aligned with the alignment marks 203, 205, 218, and 228, the first lens structure 220a and the filter structure 230 are both disposed directly over the image sensor 236, and the beam splitter 208 and the second lens structure 220b are both disposed directly over the VCSEL 238.

The workpiece 200' also includes a fifth adhesion layer 242 formed over the package substrate 202E. For example, the fifth adhesion layer 242 is formed on and around the image sensor 236 and the VCSEL 238. The fifth adhesion layer 242 may include any suitable material with a low optical absorption coefficient (or absorptivity) such as benzocyclobutene (BCB) polymer and may be deposited using any suitable method.

Referring to FIGS. 1 and 20, method 100 includes a block 130 where the package substrate 202E is aligned with the fourth substrate 202D. As described above, the package substrate 202E includes alignment marks 234 and the fourth substrate 202 includes alignment marks 228. The package substrate 202E may be moved laterally until each of the alignment marks 234 in the package substrate 202E is aligned with a corresponding alignment mark 228 in the fourth substrate 202D. That is, a wafer-level alignment process is performed to align the package substrate 202E with the fourth substrate 202D and a higher alignment accuracy may thus be achieved. Once the package substrate 202E is aligned with the fourth substrate 202D, the first region A10 of the package substrate 202E is aligned with the first region R1''' of the fourth substrate 202D, and the second region A20 of the package substrate 202E is aligned with the second region R2''' of the fourth substrate 202D. In an embodiment, upon the alignment between the package substrate 202E and the fourth substrate 202D, a distance between a center line of the image sensor 236 and a center line of the filter structure 230 may be less than 10 μm, and a distance between a center line of the VCSEL 238 and a center line of the second lens structure 220b may be less than 10 μm.

Referring to FIGS. 1 and 20, method 100 includes a block 132 where the package substrate 202E is bonded to the fourth substrate 202D via the fifth adhesion layer 242. After the package substrate 202E is aligned with the fourth substrate 202D, the fifth adhesion layer 242 directly faces a bottom surface of the fourth substrate 202D. The package substrate 202E may be moved towards the fourth substrate 202D until the fifth adhesion layer 242 bonds the package substrate 202E to the bottom surface of the fourth substrate 202D, thereby forming a workpiece 200". In some embodiments, the package substrate 202E is bonded to the fourth substrate 202D via a thermocompression bonding process or other suitable bonding processes. The workpiece 200" includes the first lens structure 220a formed directly over the filter structure 230, the filter structure 230 disposed directly over the image sensor 236, and the beam splitter 208 formed directly over the second lens structure 220b, and the second lens structure 220b formed directly over the VCSEL 238.

Referring to FIGS. 1 and 21, method 100 includes a block 134 where further processes are performed. Such further process may include performing a singulation process to cut along scribe lines or scribe channels with a cutting technique (e.g., a mechanical dicing) to divide the workpiece 200" into two or more individual optical modules such as optical module 200A" and optical module 200B". Since the first substrate 202A, the second substrate 202B, the third substrate 202C, and the fourth substrate 202D are transparent substrates, in some embodiments, only one of those substrates 202A-202D are fabricated to have scribe lines or scribe channels.

In the present embodiments, after performing the singulation process, the optical module 200A" includes the image sensor 236 electrically coupled to the package substrate 202E using bonding wires 237a, the filter structure 230 disposed directly over the image sensor 236, and the first lens structure 220a formed directly over both the filter structure 230 and the image sensor 236. In some embodiments, the optical module 200A" may be used to form an infrared (IR) camera. In an embodiment, a distance between a center line of the filter structure 230 and the center line of the image sensor 236 is less than 10 μm, and a distance between a center line of the first lens structure 220a and the center line of the image sensor 236 is less than 10 μm. The optical module 200A" also includes the first substrate 202A, the adhesion layer 214, and the second substrate 202B formed directly over the first lens structure 220a.

The optical module 200B" includes the VCSEL 238 electrically coupled to the package substrate 202E, the second lens structure 220b formed directly over the VCSEL 238, and the beam splitter 208 formed directly over both the second lens structure 220b and the VCSEL 238. In some embodiments, the optical module 200B' may be used to form a dot projector. In an embodiment, a distance between a center line of the second lens structure 220b and the center line of the VCSEL 238 is less than 10 μm, and a distance between a center line of the beam splitter 208 and the center line of the VCSEL 238 is also less than 10 μm. The optical module 200B" also includes the adhesion layer 232 and the fourth substrate 202D vertically sandwiched between the second lens structure 220b and the VCSEL 238. In various embodiments, the cutting technique employed in the singulation process forms a straight cut. That is, sidewalls 250 of the optical module 200A" and sidewalls 252 of the optical module 200B" are substantially vertical. That is, each of the first, second, third, fourth substrates 202A-202D and the package substrate 202E has a vertical sidewall, and those vertical sidewalls are aligned along the Z direction. Here, "substantially vertical" is referred to an angle formed between a sidewall and a top surface of the corresponding optical module being between 88° and 92°.

In the above embodiments described with reference to FIGS. 2-21, the workpiece 200" that is fabricated according to method 100 is diced to form one optical module 200A" and one optical module 200B". However, method 100 may be used to form a workpiece (e.g., workpiece 200''') that may be diced to form more optical modules. For example, a number of first lens structures 220a and a number of second lens structures are formed on the third substrate 202C, a number of filter structures are formed on the fourth substrate 202D, a number of beam splitters 208 are formed between the first and second wafers 202A and 202B, and a number of image sensors 236 and a number of VCSELs 238 are mounted on the package substrate 202E. Operations (e.g., flipping over, aligning, and bonding processes) may be performed to those wafers to form the workpiece 200''' represented in FIG. 22. In embodiments represented in FIG. 22, the workpiece 200''' includes multiple regions A1 for forming optical modules 200A" and multiple regions A2 for forming optical modules 200B". The workpiece 200''' may be then diced to form a number of optical modules 200A" and a number of optical modules 200B". The configuration of the workpiece 200''' represented by FIG. 22 is just an example and is not intended to be limiting.

In the above embodiments described with reference to FIGS. 1-22, the optical module 200A" and the optical module 200B" having different structures are formed simultaneously. As described above, besides those optical elements (e.g., the first lens structure 220a, filter structure 230, image sensor 236), the optical module 200A" also includes the first substrate 202A, the adhesion layer 214, and the second substrate 202B formed directly over the first lens structure 220a; similarly, the optical module 200B" also includes the adhesion layer 232 and the fourth substrate 202D vertically sandwiched between the second lens structure 220b and the VCSEL 238. To form, for example, more dot projectors and more IR cameras while reducing total thicknesses of the optical modules 200A" and 200B", other methods are possible. FIG. 23 depicts a flowchart illustrating exemplary operations in an alternative method 300 of forming a number of first optical modules and a number of second optical modules according to embodiments of the present disclosure. Method 300 is described below in conjunction with FIGS. 24-33, which are fragmentary cross-sectional views of workpieces at different stages of fabrication according to embodiments of method 300.

Referring to FIGS. 23 and 24, method 300 includes a block 302 where a first workpiece 400A is provided. The first workpiece 400A includes a first substrate 402A. In the present embodiments, the first substrate 402A includes a number of alignment marks (not shown). The first workpiece 400A also includes a number of lens structures $404_1$, ... $404_{N-1}$, $404_N$ formed over predetermined regions $A_1$, ... $A_{N-1}$, $A_N$ of the first substrate 402A. N is an integer and is no less than 3. For example, lens structure $404_1$ is formed over a region $A_1$ of the first substrate 402A, lens structure $404_{N-1}$ is formed over a region $A_{N-1}$ of the first substrate 402A, and lens structure $404_N$ is formed over a region $A_N$ of the first substrate 402A. Those lens structures $404_1$, ... $404_{N-1}$, $404_N$ have substantially the same configuration (e.g., dimension, function). The first workpiece 400A also includes an adhesion layer 406 formed over the first substrate 402A. The first substrate 402A may be similar to the third substrate 202C, each of the lens structures $404_1$, ... $404_{N-1}$, $404_N$ may be similar to the first lens structure 220a, the adhesion layer 406 may be similar to the adhesion layer 222, and repeated descriptions are omitted for reason of simplicity.

Referring to FIGS. 23 and 25, method 300 includes a block 304 where a second workpiece 400B is provided. The second workpiece 400B includes a second substrate 402B having a number of alignment marks (not shown). The second workpiece 400B also includes a number of filter structures $408_1, 408_2, \ldots 408_N$ formed over predetermined regions $B_1, B_2, \ldots B_N$ of the second substrate 402B, respectively. In the present embodiment, the number of the filter structures formed over the second substrate 402B is the same as the number of lens structures formed over the first substrate 402A. In the present embodiments, the regions $B_1, B_2, \ldots B_N$ for forming filter structures $408_1, 408_2, \ldots 408_N$ thereon are determined based on the determined locations of the regions $A_1, \ldots A_{N-1}, A_N$. More specifically, when the first workpiece 400A is flipped over and upon the alignment between the first substrate 402A and the second substrate 402B, the regions $A_1, \ldots A_{N-1}, A_N$ would be aligned with the regions $B_N, \ldots B_2, B_1$, respectively. Those filter structures $408_1, 408_2, \ldots 408_N$ have substantially the same configuration (e.g., dimension and function). The second workpiece 400B also includes an adhesion layer 410 formed over the second substrate 402B. The second substrate 402B may be similar to the fourth substrate 202D, each of the filter structures $408_1, 408_2, \ldots 408_N$ may be similar to the filter structure 230, the adhesion layer 410 may be similar to the adhesion layer 232, and repeated descriptions are omitted for reason of simplicity.

Referring to FIGS. 23 and 26, method 300 includes a block 306 where the first workpiece 400A is flipped over. As represented in FIG. 26, after the first workpiece 400A is flipped over, the first substrate 402A is at the top and is disposed over the lens structures $404_1, \ldots 404_{N-1}, 404_N$. With the flip over of the first workpiece 400A, block 306 proceeds to the wafer-level alignment of the first substrate 402A and the second substrate 402B. The alignment of the first substrate 402A and the second substrate 402B may be similar to the alignment of the first substrate 202A and second substrate 202B. For example, the second substrate 402B may be moved laterally until each alignment mark of the second substrate 402B is aligned with a corresponding alignment mark of the first substrate 402A.

Referring to FIGS. 23 and 26, method 300 includes a block 308 where the first substrate 402A is bonded to the second substrate 402B. The first adhesion layer 406 and the second adhesion layer 410 may bond the first substrate 402A to the second substrate 402B, thereby forming a bonded structure 400'. After bonding the first substrate 402A to the second substrate 402B, in the illustrated embodiment represented in FIG. 26, the lens structure $404_1$ is formed directly over the filter structure $408_N$. In an embodiment, each center line of the lens structures $404_1, \ldots 404_{N-1}, 404_N$ is substantially aligned with a corresponding center line of the filter structure disposed thereunder. Each lens structure is vertically spaced apart from a corresponding filter structure by the first adhesion layer 406 and the second adhesion layer 410. After bonding the first substrate 402A to the second substrate 402B, a thinning process may be performed to thin the first substrate 402A and the second substrate 402B from the backside of the first and second substrates to reduce a total thickness of the bonded structure 400'. After the thinning process, a bottom surface of the second substrate 402B may be referred to as a bottom surface 402S.

In the present embodiments, the first workpiece 400A is flipped over and the first substrate 402A is bonded to the second substrate 402B. In some other embodiments, the configurations of the filter structures and the lens structures and the locations of the predetermined regions of the first and second substrates 402A, 402B may be adjusted such that the first substrate 402A may be bonded to the second substrate 402B similar to those described with reference to FIG. 18 without flipping over the first workpiece 400A or the second workpiece 400B.

Referring to FIGS. 23 and 27, method 300 includes a block 310 where the bonded structure 400' is diced into N optical units 420. In the present embodiments, a cutting technique (e.g., a mechanical dicing) may be employed to cut the bonded structure 400' along scribe lines or scribe channels on the first and/or the second substrate 402A, 402B to dice the bonded structure 400' into N optical units 420. Each optical unit 420 includes a lens structure formed directly over a filter structure. In various embodiments, the cutting technique forms a straight cut. That is, sidewalls of each optical unit 420 are substantially vertical. That is, each of the first and second substrates 402A and 402B has a vertical sidewall, and those vertical sidewalls are aligned along the Y direction.

Referring to FIGS. 23 and 28, method 300 includes a block 312 where a third workpiece 400C is provided. The third workpiece 400C includes N beam splitters $424_1, 424_2, \ldots, 424_N$ sandwiched between a substrate 402C1 and a third substrate 402C2. The substrate 402C1 and the third substrate 402C2 each includes a number of alignment marks (not shown). The N beam splitters $424_1, 424_2, \ldots, 424_N$ are formed directly over predetermined regions $C_1, C_2, \ldots, C_N$ of the third substrate 402C2. Those beam splitters have substantially same structures and configurations. Each beam splitter includes an upper part and a lower part, and the lower part is spaced apart from the upper part by an adhesion structure 426. The adhesion structure 426 may include one or more adhesion layers and may be similar to the adhesion layer 214. The formation of the beam splitters $424_1, 424_2, \ldots, 424_N$ may be similar to the that of the beam splitter 208 described with reference to FIG. 11, and repeated description is omitted for reason of simplicity.

Referring to FIGS. 23 and 29, method 300 includes a block 314 where a fourth workpiece 400D is provided. The fourth workpiece 400D includes a fourth substrate 402D having a number of alignment marks (not shown) and a number of lens structures $428_1, 428_2, \ldots 428_N$ formed over predetermined regions $D_1, D_2, \ldots D_N$ of the fourth substrate 402D, respectively. In the present embodiments, the regions $D_1, D_2, \ldots D_N$ for forming lens structures $428_1, 428_2, \ldots 428_N$ thereon are determined based on the determined locations of the regions $C_1, C_2, \ldots, C_N$. More specifically, when the third substrate 402C2 is aligned with the fourth substrate 402D, the regions $D_1, D_2, \ldots D_N$ would be aligned with the regions $C_1, C_2, \ldots, C_N$, respectively. The fourth workpiece 400D also includes an adhesion layer 430 formed over the fourth substrate 402D. The fourth substrate 402D may be similar to the third substrate 202C, each of the lens structures $428_1, 428_2, \ldots 428_N$ may be similar to the second lens structure 220b, the adhesion layer 430 may be similar to the adhesion layer 222, and repeated descriptions are omitted for reason of simplicity.

Referring to FIGS. 23 and 30, method 300 includes a block 316 where the third substrate 402C2 is aligned with the fourth substrate 402D. The alignment of the third substrate 402C2 and the fourth substrate 402D may be similar to the alignment of the third substrate 202C and second substrate 202B.

Referring to FIGS. 23 and 30, method 300 includes a block 318 where the third substrate 402C2 is bonded to the fourth substrate 402D. After the third substrate 402C2 is aligned with the fourth substrate 402D, a thermocompression bonding process may be performed to bond the third substrate 402C2 to the fourth substrate 402D, thereby forming a bonded structure 400". Upon the formation of the bonded structure 400", each of the beam splitters $424_1$, $424_2, \ldots, 424_N$ is formed directly over a corresponding lens structure of those lens structures $428_1, 428_2, \ldots 428_N$. In an embodiment, each center line of the lens structures $428_1$, $428_2, \ldots 428_N$ is substantially aligned with a center line of a corresponding beam splitter disposed thereunder. After bonding the third substrate 402C2 to the fourth substrate 402D, a thinning process may be performed to thin the fourth substrate 402D from its backside.

Referring to FIGS. 23 and 31, method 300 includes a block 320 where the bonded structure 400" is diced into N optical units 440. The dicing of the bonded structure 400" may be similar to the dicing of the bonded structure 400'. Each optical unit 440 includes a beam splitter formed directly over a lens structure. In various embodiments, sidewalls of each optical unit 440 are substantially vertical. That is, each of the substrates 402C1, 402C2 and 402D has a vertical sidewall, and those vertical sidewalls are aligned along the Y direction.

Figure 32:
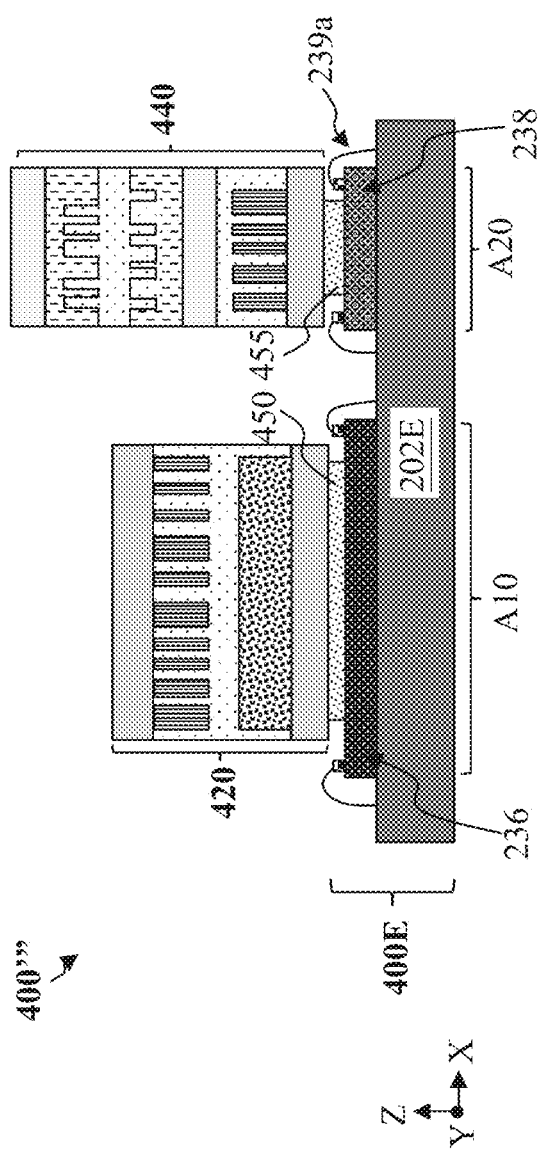

Referring to FIGS. 23 and 32, method 300 includes a block 322 where a fifth workpiece 400E is provided. The fifth workpiece 400E may be similar to the workpiece 200' described with reference to FIG. 19 and repeated description is omitted for reason of simplicity.

Referring to FIGS. 23 and 32, method 300 includes a block 324 where the optical unit 420 is mounted to the image sensor 236 via an adhesion layer 450 and the optical unit 440 is mounted to the vertical-cavity surface-emitting laser (VCSEL) 238 via an adhesion layer 455, thereby forming a bonded structure 400'''. The adhesion layers 450 and 455 may be similar to the adhesion layer 214a.

Figure 33:
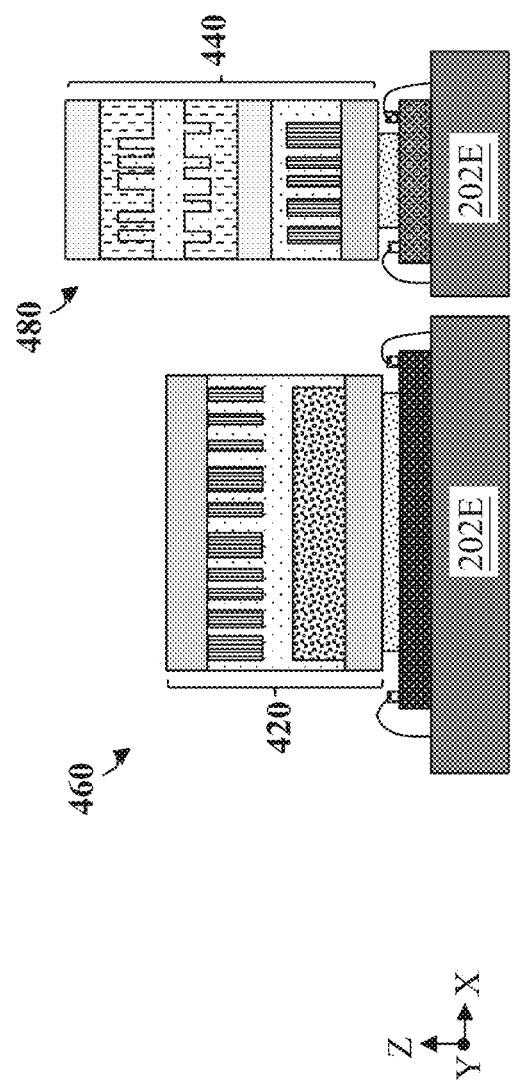
Figure 34:
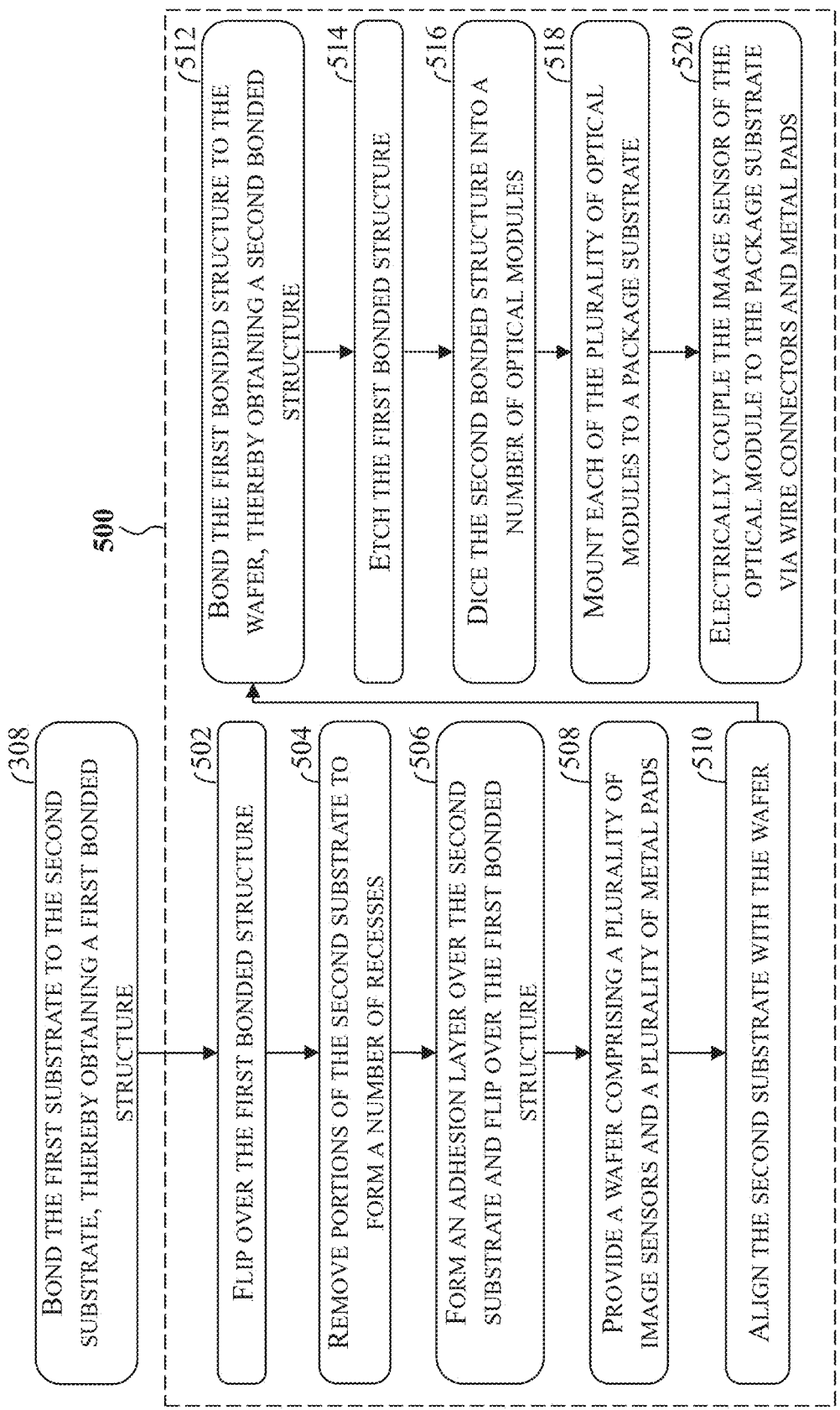
FIG. 34 illustrates a flow chart of a second alternative method for forming a number of first optical modules, according to one or more aspects of the present disclosure.

Referring to FIGS. 23 and 33, method 300 includes a block 326 where the bonded structure 400''' is diced to form a first optical module 460 and a second optical module 480. Since optical elements for the optical units 420 and optical elements for optical units 440 are separately formed, the first optical module 460 has a reduced thickness than that of optical module 200A", and the second optical module 480 has a reduced thickness than that of the optical module.

In the above embodiments described with reference to FIGS. 1-33, before being bonded with other optical elements (beam splitter, lens structure, and/or filter structure), the image sensor 236 and the VCSEL 238 are already electrically coupled to the package substrate 202E via the bonding wires (e.g., bonding wires 237a and 239a) and metal pads (e.g., metal pads 237b and 239b). In some other embodiments, the image sensor 236 and the VCSEL 238 may be electrically coupled to the package substrate 202E after being bonded to other optical elements. FIG. 34 depicts a flowchart of an alternative method 500 for forming a number of first optical modules according to embodiments of the present disclosure. Method 500 is described in conjunction with FIGS. 35-46, which are fragmentary cross-sectional views of workpieces at different stages of fabrication according to embodiments of method 500. More specifically, after forming the first bonded structure 400' (shown in FIG. 26), operations of method 500 are performed.

Referring to FIGS. 34 and 35, method 500 includes a block 502 where the first bonded structure 400' is flipped over. As represented in FIG. 35, the second substrate 402B is at the top and is disposed over the filter structures $408_1$, $408_2, \ldots 408_N$. The flipped bonded structure 400' may be referred to as a first bonded structure 600.

Referring to FIGS. 34 and 36, method 500 includes a block 504 where portions of the second substrate 402B are recessed to form a number of recesses 602. In some embodiments, a mask film may be deposited over the bottom surface 402S of the second substrate 402B and then patterned by a lithography process. The patterned mask film exposes portions of the second substrate 402B that are not disposed directly over the regions $A_1, \ldots A_{N-1}, A_N$ of the first substrate 402A. While using the patterned mask film as an etch mask, an etching process is performed to recess portions of the second substrate 402B exposed by the patterned mask film to form a number of recesses 602. The patterned mask film may be then selectively removed.

Referring to FIGS. 34 and 37, method 500 includes a block 506 where an adhesion layer 604 is formed over the bottom surface 402S of the second substrate 402B. In the present embodiments, the adhesion layer 604 is formed on the bottom surface 402S of the second substrate 402B without being formed in the recesses 602. The composition of the adhesion layer 604 may be similar to that of the adhesion layer 214a. After forming the adhesion layer 604, as represented in FIG. 38, the first bonded structure 600 is flipped over and the first substrate 402A is at the top.

Referring to FIGS. 34 and 39, method 500 includes a block 508 where a wafer 610 is provided. The wafer 610 includes a number of image sensors $612_1, 612_2, \ldots 612_N$ formed in and over a semiconductor substrate (not separately labeled). Detailed structural features of the image sensors are omitted for reason of simplicity. The wafer 610 also includes a number of metal pads $614_1, 614_2, \ldots 614_N$ and $616_1, 616_2, \ldots 616_N$ for external connections of the image sensors $612_1, 612_2, \ldots 612_N$. In the present embodiment, each image sensor is disposed between two corresponding metal pads. In some embodiments, the wafer 610 may include a number of alignment marks.

Referring to FIGS. 34 and 40, method 500 includes a block 510 where the second substrate 420B is aligned with the wafer 610. The alignment between the wafer 610 and the second substrate 402B may be similar to the alignment described above with reference to FIG. 15. Upon the alignment between the wafer 610 and the second substrate 420B, each of the lens structures $404_1, \ldots 404_{N-1}, 404_N$ and each of the filter structures $408_1, 408_2, \ldots 408_N$ are disposed directly over a corresponding image sensor of the image sensors $612_1, 612_2, \ldots 612_N$, and each of the metal pads $614_1, 614_2, \ldots 614_N$ and its corresponding adjacent metal pad (e.g., $616_1, 616_2, \ldots,$ or $616_N$) are disposed directly under a corresponding recess 602.

Referring to FIGS. 34 and 40, method 500 includes a block 512 where the first bonded structure 600 is bonded to the wafer 610. After the second substrate 420B is aligned with the wafer 610, the first bonded structure 600 is bonded to the wafer 610 via the adhesion layer 604, thereby obtaining a second bonded structure 620. In the present embodiments, the second bonded structure 620 includes metal pads $614_1, 614_2, \ldots 614_N$ and $616_1, 616_2, \ldots, 616_N$ placed in the recesses 602. Each lens structure (e.g., lens structure $404_1, \ldots 404_{N-1},$ or $404_N$) is disposed directly over a corresponding filter structure (e.g., filter structure $408_N$), and the corresponding filter structure (e.g., filter structure $408_1$, $408_2, \ldots,$ or $408_N$) is disposed directly over a corresponding image sensor (e.g., image sensor $612_1, 612_2, \ldots,$ or $612_N$).

Figure 41:
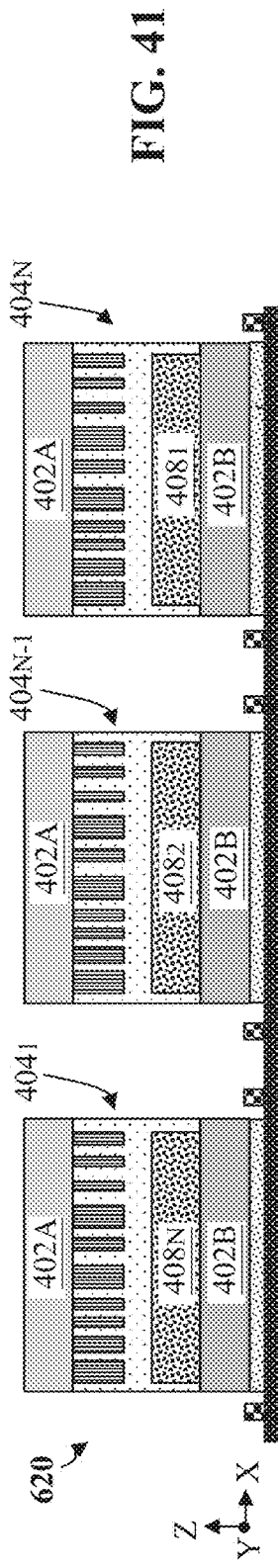

Referring to FIGS. 34 and 41, method 500 includes a block 514 where a partial dicing technique or an etching process is performed to remove portions of the first bonded structure 600 to expose the metal pads $614_1, 614_2, \ldots 614_N$ and metal pads $616_1, 616_2, \ldots, 616_N$. In an embodiment, a patterned mask film may be formed over the second bonded structure 620 and configured to expose the portions of the first bonded structure 600 disposed directly over the recesses 602. While using the patterned mask film as an etch mask, the etching process is performed to remove those exposed portions of the first bonded structure 600, thereby exposing the metal pads $614_1, 614_2, \ldots 614_N$ and metal pads $616_1, 616_2, \ldots, 616_N$. The patterned mask film may be then selectively removed.

Figure 42:
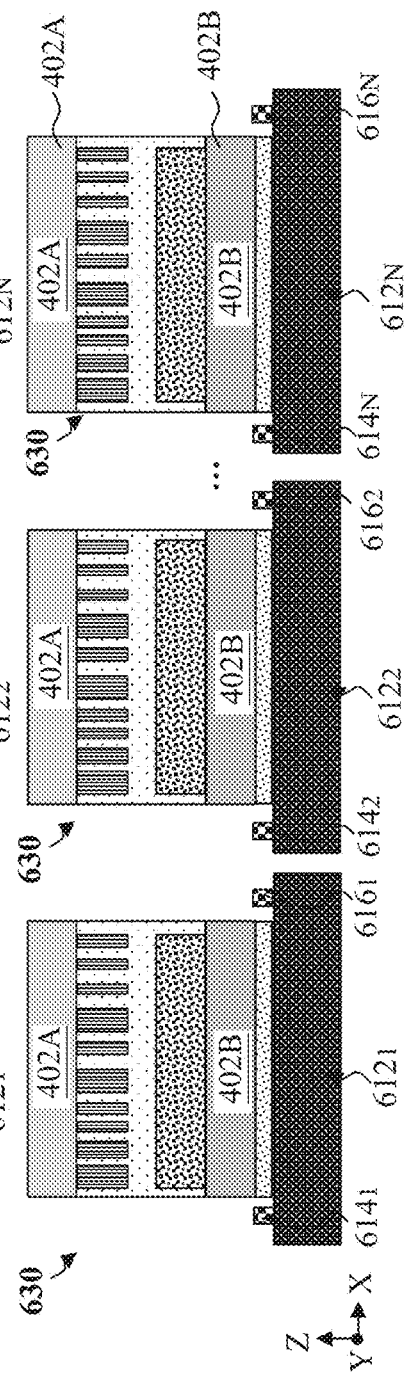

Referring to FIGS. 34 and 42, method 500 includes a block 516 where the second bonded structure 620 is diced into N optical units 630. The dicing of the second bonded structure 620 may be similar to the dicing of the bonded structure 400'. Each optical unit 630 includes an image sensor, a filter structure formed directly over the image sensor, and a lens structure formed directly over the filter structure.

Figure 43:
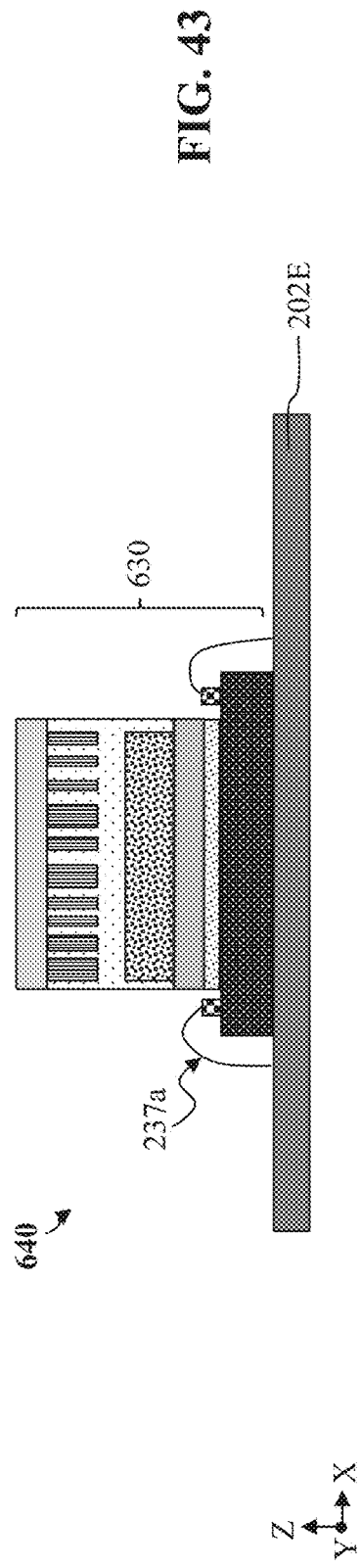

Referring to FIGS. 34 and 43, method 500 includes a block 518 where one of the optical units 630 is mounted to the package substrate 202E, thereby forming an optical module 640. The optical unit 630 may be mounted to the package substrate 202E by any suitable methods, such as by an adhesion layer (not shown). In some embodiments, the optical module 640 may be implemented to form an IR camera. Similar operations may be performed to form a dot projector that includes a VCSEL, a beam splitter, and a lens structure.

Referring to FIGS. 34 and 43, method 500 includes a block 520 where the image sensor of the mounted optical module 640 is wired to the package substrate 202E. In the present embodiments, the image sensor is electrically connected to the package substrate 202E by bonding wires 237a and the metal pads (e.g., metal pads $614_1$ and $616_1$). Other ways may be employed to fulfill the electrical connection between the image sensor and the package substrate 202E. For example, in embodiments represented in FIGS. 44-46, through-substrate vias (TSVs) (not separately shown) and connectors may be used to fulfill the electrical connection between the image sensor and the package substrate 202E.

FIG. 44 depicts a workpiece 650 that includes the first bonded structure 600 (shown in FIG. 35) bonded to a wafer 660 via an adhesion layer 670. The workpiece 650 may be similar to the second bonded structure 620 except that, instead of having metal pads, the wafer 660 includes TSVs (not shown) formed in the wafer 660 and a number of connectors 665 such as Ball Grid Array ("BGA") balls, or bumps formed under the bottom surface of the wafer 660. With reference to FIG. 45, the workpiece 650 is diced into N optical units 680. Each optical unit 680 includes an image sensor, a filter structure formed directly over the image sensor, and a lens structure formed directly over the filter structure. Each optical unit 680 has vertical sidewalls. With reference to FIG. 46, after forming the optical units 680, one of the optical units 680 may be mounted and electrically coupled to the package substrate 202E via the connectors 665, thereby forming an optical module 690. In some embodiments, the optical module 690 may be used to form an IR camera. Similar operations may be performed to form other types of optical modules (e.g., the optical module 480 that may be used to form a dot projector).

Embodiments of the present disclosure provide advantages. For example, methods of the present disclosure include using wafer-level alignments and bonding processes to facilitate the formation of a number of optical modules. Those optical modules may have same or different structures and functions. For example, some optical modules may be implemented to form IR cameras, and some optical modules may be implemented to form dot projectors. These wafer-level alignments for forming optical modules are generally beneficial because of the increase in productivity, the reduction in associated costs, and the improvement in quality. By fabricating those optical elements using semiconductor-comparable processes, optical modules with reduced dimensions may be obtained. Methods of the present disclosure may be readily applied to formation of other types of optical modules that include vertically stacked optical elements.

The present disclosure provides for many different embodiments. Semiconductor structures and methods of fabrication thereof are disclosed herein. In one exemplary aspect, the present disclosure is directed to a method. The method includes forming a plurality of first optical elements over a first wafer, forming a plurality of second optical elements over a second wafer, aligning the first wafer with the second wafer, wherein, upon the aligning of the first wafer with the second wafer, each of the plurality of first optical elements is vertically overlapped with a corresponding second optical element of the plurality of second optical elements, after the aligning of the first wafer with the second wafer, bonding the first wafer with the second wafer, thereby obtaining a first bonded structure, forming a plurality of third optical elements over a third wafer, aligning the second wafer of the first bonded structure with the third wafer, wherein, upon the aligning of the second wafer with the third wafer, each of the plurality of second optical elements is vertically overlapped with a corresponding third optical element of the plurality of third optical elements, and after the aligning of the second wafer with the third wafer, bonding the second wafer of the first bonded structure to the third wafer, thereby obtaining a second bonded structure.

In some embodiments, each of the plurality of first optical elements may include a beam splitter, each of the plurality of second optical elements may include a lens structure, and each of the plurality of third optical elements may include a vertical cavity surface emitting laser (VCSEL). In some embodiments, each of the plurality of first optical elements may include a lens structure, each of the plurality of second optical elements may include a filter, and each of the plurality of third optical elements may include an image sensor. In some embodiments, each lens structure may include a plurality of lenses. In some embodiments, the method may include forming a plurality of fourth optical elements over the first wafer, wherein a type of the plurality of fourth optical elements is the same as a type of the plurality of first optical elements, and forming a plurality of fifth optical elements over the third wafer, wherein a type of the plurality of fifth optical elements is different from a type of the plurality of third optical elements. Upon the obtaining of the second bonded structure, each of the plurality of fourth optical elements may be vertically overlapped with a corresponding fifth optical element of the plurality of fifth optical elements. In some embodiments, the method may include providing a fourth wafer and a fifth wafer, forming upper portions of a plurality of sixth optical elements over the fourth wafer, forming lower portions of the plurality of sixth optical elements over the fifth wafer, flipping over the fourth wafer, and after the flipping over of the fourth wafer, aligning the fourth wafer with the fifth wafer, after the aligning of the fourth wafer with the fifth wafer, bonding the fourth wafer with the fifth wafer, thereby obtaining a third bonded structure that comprises the plurality of sixth optical elements. Upon the aligning and bonding of the fourth wafer and the fifth wafer, each of the upper portions and a corresponding lower portion of the lower portions may form a corresponding optical element of the plurality of sixth optical elements. In some embodiments, the method may also include aligning the fifth wafer with the first wafer, wherein, upon the aligning of the fifth wafer with the first wafer, each of the plurality of sixth optical elements is vertically overlapped with a corresponding first optical element of the plurality of first optical elements, and after the aligning of the fifth wafer with the first wafer, bonding the fifth wafer with the first wafer, thereby obtaining a fourth bonded structure. In some embodiments, the method may also include dicing the fourth bonded structure to form a plurality of first optical modules and a plurality of second optical modules. In some embodiments, each of the plurality of first optical modules may include one of the plurality of first optical elements, one of the plurality of second optical elements, and one of the plurality of third optical elements, and each of the plurality of second optical modules may include one of the plurality of fourth optical elements, one of the plurality of fifth optical elements, and one of the plurality of six optical elements. In some embodiments, each of the plurality of first optical modules and each of the plurality of second optical modules may include a vertical sidewall.

In another exemplary aspect, the present disclosure is directed to a method. The method includes forming a plurality of first optical elements over a first wafer, forming a plurality of second optical elements over a second wafer, forming a plurality of third optical elements over a third wafer, after the forming of the plurality of first optical elements and the forming of the plurality of second optical elements, aligning the first wafer with the second wafer, after the aligning of the first wafer with the second wafer, bonding the first wafer with the second wafer, after the forming of the plurality of third optical elements, aligning the second wafer with the third wafer, after the aligning of the second wafer with the third wafer, bonding the first wafer and the second wafer with the third wafer, thereby obtaining a bonded structure, and dicing the bonded structure to form a plurality of first optical modules, where each of the plurality of first optical modules comprises one of the plurality of first optical elements, one of the plurality of second optical elements, and one of the plurality of third optical elements, and wherein each of the plurality of first optical modules comprises a vertical sidewall.

In some embodiments, the bonding of the first wafer with the second wafer may include applying an adhesive layer over the plurality of second optical elements, pressing the adhesive layer towards a bottom surface of the first wafer, and conducting a heating process to solidify the adhesive layer. In some embodiments, the method may also include, before the aligning of the first wafer with the second wafer, flipping over the first wafer. In some embodiments, the bonding of the first wafer with the second wafer may include, before the flipping over of the first wafer, applying a first adhesive layer over the plurality of first optical elements, applying a second adhesive layer over the plurality of second optical elements, after the flipping over of the first wafer and after the aligning of the first wafer with the second wafer, pressing the first adhesive layer towards the second adhesive layer, and conducting a heating process to solidify the first adhesive layer and the second adhesive layer. In some embodiments, the method may also include, after the bonding of the first wafer with the second wafer, thinning down the first wafer and the second wafer. In some embodiments, the method may also include providing a workpiece comprising a fourth wafer, a fifth wafer, and a plurality of fourth optical elements vertically sandwiched between the fourth wafer and the fifth wafer, where an upper portion of each of the plurality of fourth optical elements may be spaced apart from a corresponding lower portion of each of the plurality of fourth optical elements by an adhesive layer.

In yet another exemplary aspect, the present disclosure is directed to an optical module structure. The optical module includes a first substrate, an image sensor disposed over and electrically coupled to the first substrate, a first adhesive layer disposed over the image sensor, a second substrate disposed over the image sensor and attached to the image sensor via the first adhesive layer, a filter disposed over the second substrate and disposed directly over with the image sensor, a third substrate disposed over the filter and attached to the filter via a second adhesive layer, and a lens structure disposed over the third substrate and disposed directly over the image sensor and the filter, where a sidewall surface of the first substrate aligns with a sidewall surface of the second substrate.

In some embodiments, the sidewall surface of the first substrate may be a substantially vertical sidewall surface. In some embodiments, the filter may be spaced apart from the image sensor by the first adhesive layer and the second substrate. In some embodiments, the first substrate may include a printed circuit board, and the image sensor may be electrically coupled to the first substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of first optical elements over a first wafer;
   forming a plurality of second optical elements over a second wafer;
   aligning the first wafer with the second wafer, wherein, upon the aligning of the first wafer with the second wafer, each of the plurality of first optical elements is vertically overlapped with a corresponding second optical element of the plurality of second optical elements;
   after the aligning of the first wafer with the second wafer, bonding the first wafer with the second wafer, thereby obtaining a first bonded structure;
   forming a plurality of third optical elements over a third wafer;
   aligning the second wafer of the first bonded structure with the third wafer, wherein, upon the aligning of the second wafer with the third wafer, each of the plurality of second optical elements is vertically overlapped with a corresponding third optical element of the plurality of third optical elements; and
   after the aligning of the second wafer with the third wafer, bonding the second wafer of the first bonded structure to the third wafer, thereby obtaining a second bonded structure.

2. The method of claim 1, wherein each of the plurality of first optical elements comprises a beam splitter, each of the plurality of second optical elements comprises a lens structure, and each of the plurality of third optical elements comprises a vertical cavity surface emitting laser (VCSEL).

3. The method of claim 1, wherein each of the plurality of first optical elements comprises a lens structure, each of the plurality of second optical elements comprises a filter, and each of the plurality of third optical elements comprises an image sensor.

4. The method of claim 3, wherein each lens structure comprises a plurality of lenses.

5. The method of claim 3, further comprising:
forming a plurality of fourth optical elements over the first wafer, wherein a type of the plurality of fourth optical elements is the same as a type of the plurality of first optical elements; and
forming a plurality of fifth optical elements over the third wafer, wherein a type of the plurality of fifth optical elements is different from a type of the plurality of third optical elements,
wherein, upon the obtaining of the second bonded structure, each of the plurality of fourth optical elements is vertically overlapped with a corresponding fifth optical element of the plurality of fifth optical elements.

6. The method of claim 5, further comprising:
providing a fourth wafer and a fifth wafer;
forming upper portions of a plurality of sixth optical elements over the fourth wafer;
forming lower portions of the plurality of sixth optical elements over the fifth wafer;
flipping over the fourth wafer;
after the flipping over of the fourth wafer, aligning the fourth wafer with the fifth wafer; and
after the aligning of the fourth wafer with the fifth wafer, bonding the fourth wafer with the fifth wafer, thereby obtaining a third bonded structure that comprises the plurality of sixth optical elements,
wherein, upon the aligning and bonding of the fourth wafer and the fifth wafer, each of the upper portions and a corresponding lower portion of the lower portions form a corresponding optical element of the plurality of sixth optical elements.

7. The method of claim 6, further comprising:
aligning the fifth wafer with the first wafer, wherein, upon the aligning of the fifth wafer with the first wafer, each of the plurality of sixth optical elements is vertically overlapped with a corresponding first optical element of the plurality of first optical elements; and
after the aligning of the fifth wafer with the first wafer, bonding the fifth wafer with the first wafer, thereby obtaining a fourth bonded structure.

8. The method of claim 7, further comprising:
dicing the fourth bonded structure to form a plurality of first optical modules and a plurality of second optical modules.

9. The method of claim 8,
wherein each of the plurality of first optical modules comprises one of the plurality of first optical elements, one of the plurality of second optical elements, and one of the plurality of third optical elements, and
wherein each of the plurality of second optical modules comprises one of the plurality of fourth optical elements, one of the plurality of fifth optical elements, and one of the plurality of six optical elements.

10. The method of claim 8, wherein each of the plurality of first optical modules and each of the plurality of second optical modules comprise a vertical sidewall.

11. A method, comprising:
forming a plurality of first optical elements over a first wafer;
forming a plurality of second optical elements over a second wafer;
forming a plurality of third optical elements over a third wafer;
after the forming of the plurality of first optical elements and the forming of the plurality of second optical elements, aligning the first wafer with the second wafer;
after the aligning of the first wafer with the second wafer, bonding the first wafer with the second wafer;
after the forming of the plurality of third optical elements, aligning the second wafer with the third wafer;
after the aligning of the second wafer with the third wafer, bonding the first wafer and the second wafer with the third wafer, thereby obtaining a bonded structure; and
dicing the bonded structure to form a plurality of first optical modules, wherein each of the plurality of first optical modules comprises one of the plurality of first optical elements, one of the plurality of second optical elements, and one of the plurality of third optical elements, and wherein each of the plurality of first optical modules comprises a vertical sidewall.

12. The method of claim 11, wherein the bonding of the first wafer with the second wafer comprises:
applying an adhesive layer over the plurality of second optical elements;
pressing the adhesive layer towards a bottom surface of the first wafer; and
conducting a heating process to solidify the adhesive layer.

13. The method of claim 11, further comprising:
before the aligning of the first wafer with the second wafer, flipping over the first wafer.

14. The method of claim 13, wherein the bonding of the first wafer with the second wafer comprises:
before the flipping over of the first wafer, applying a first adhesive layer over the plurality of first optical elements;
applying a second adhesive layer over the plurality of second optical elements;
after the flipping over of the first wafer and after the aligning of the first wafer with the second wafer,
pressing the first adhesive layer towards the second adhesive layer; and
conducting a heating process to solidify the first adhesive layer and the second adhesive layer.

15. The method of claim 11, further comprising:
after the bonding of the first wafer with the second wafer, thinning down the first wafer and the second wafer.

16. The method of claim 11, further comprising:
providing a workpiece comprising a fourth wafer, a fifth wafer, and a plurality of fourth optical elements vertically sandwiched between the fourth wafer and the fifth wafer,
wherein an upper portion of each of the plurality of fourth optical elements is spaced apart from a corresponding lower portion of each of the plurality of fourth optical elements by an adhesive layer.

17. An optical module, comprising:
a first substrate;
an image sensor disposed over and electrically coupled to the first substrate;
a first adhesive layer disposed over the image sensor;

a second substrate disposed over the image sensor and attached to the image sensor via the first adhesive layer;
a filter disposed over the second substrate and disposed directly over with the image sensor;
a third substrate disposed over the filter and attached to the filter via a second adhesive layer; and
a lens structure disposed over the third substrate and disposed directly over the image sensor and the filter,
wherein a sidewall surface of the first substrate aligns with a sidewall surface of the second substrate.

18. The optical module of claim 17, wherein the sidewall surface of the first substrate is a substantially vertical sidewall surface.

19. The optical module of claim 17, wherein the filter is spaced apart from the image sensor by the first adhesive layer and the second substrate.

20. The optical module of claim 17, wherein the first substrate comprises a printed circuit board, and the image sensor is electrically coupled to the first substrate.

* * * * *